US010114286B2

(12) United States Patent
Wu et al.

(10) Patent No.: US 10,114,286 B2
(45) Date of Patent: *Oct. 30, 2018

(54) PHOTORESIST AND METHOD

(71) Applicant: Taiwan Semiconductor Manufacturing Company, Ltd., Hsinchu (TW)

(72) Inventors: Chen-Hau Wu, New Taipei (TW); Wei-Han Lai, New Taipei (TW); Ching-Yu Chang, Yuansun Village (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/443,752

(22) Filed: Feb. 27, 2017

(65) Prior Publication Data

US 2017/0176857 A1 Jun. 22, 2017

Related U.S. Application Data

(63) Continuation of application No. 14/334,590, filed on Jul. 17, 2014, now Pat. No. 9,581,908.

(60) Provisional application No. 61/994,741, filed on May 16, 2014.

(51) Int. Cl.
| | | |
|---|---|---|
| *G03F 7/039* | (2006.01) | |
| *G03F 7/16* | (2006.01) | |
| *G03F 7/40* | (2006.01) | |
| *G03F 7/038* | (2006.01) | |
| *G03F 7/30* | (2006.01) | |
| *G03F 7/32* | (2006.01) | |
| *G03F 7/004* | (2006.01) | |
| *G03F 7/20* | (2006.01) | |
| *G03F 7/38* | (2006.01) | |
| *H01L 21/027* | (2006.01) | |

(52) U.S. Cl.
CPC ............ *G03F 7/038* (2013.01); *G03F 7/0045* (2013.01); *G03F 7/039* (2013.01); *G03F 7/16* (2013.01); *G03F 7/168* (2013.01); *G03F 7/2041* (2013.01); *G03F 7/30* (2013.01); *G03F 7/325* (2013.01); *G03F 7/38* (2013.01); *G03F 7/40* (2013.01); *H01L 21/0274* (2013.01)

(58) Field of Classification Search
CPC ...... G03F 7/039; G03F 7/0392; G03F 7/0397; G03F 7/0045; G03F 7/038; G03F 7/16; G03F 7/168; G03F 7/2041; G03F 7/30; G03F 7/325; G03F 7/38; G03F 7/40
See application file for complete search history.

(56) References Cited

U.S. PATENT DOCUMENTS

| | | |
|---|---|---|
| 4,072,527 A | 2/1978 | Fan |
| 4,212,935 A | 7/1980 | Canavello et al. |
| 4,268,601 A | 5/1981 | Namiki et al. |
| 4,289,845 A | 9/1981 | Bowden et al. |
| 4,346,164 A | 8/1982 | Tabarelli et al. |
| 4,491,628 A | 1/1985 | Ito et al. |
| 4,663,275 A | 5/1987 | West et al. |
| 4,777,119 A | 10/1988 | Brault et al. |
| 4,939,070 A | 7/1990 | Brunsvold et al. |
| 5,002,850 A | 3/1991 | Shinozaki et al. |
| 5,268,260 A | 12/1993 | Bantu et al. |
| 5,288,588 A | 2/1994 | Yukawa et al. |
| 5,738,975 A | 4/1998 | Nakano et al. |
| 5,750,312 A | 5/1998 | Chandross et al. |
| 5,766,824 A | 6/1998 | Batchelder et al. |
| 5,856,065 A | 1/1999 | Hagen |
| 5,863,710 A | 1/1999 | Wakiya et al. |
| 5,886,102 A | 3/1999 | Sinta et al. |
| 5,889,141 A | 3/1999 | Marrocco, III et al. |
| 5,902,599 A | 5/1999 | Anseth et al. |
| 6,008,265 A | 12/1999 | Vallee et al. |
| 6,068,962 A | 5/2000 | Uetani et al. |
| 6,147,249 A | 11/2000 | Watanabe et al. |
| 6,187,504 B1 | 2/2001 | Suwa et al. |
| 6,306,554 B1 | 10/2001 | Barclay et al. |
| 6,548,226 B2 | 4/2003 | Lin |
| 6,627,377 B1 | 9/2003 | Itatani et al. |
| 6,787,289 B2 | 9/2004 | Yamada et al. |
| 6,788,477 B2 | 9/2004 | Lin |
| 6,790,579 B1 | 9/2004 | Goodall et al. |

(Continued)

FOREIGN PATENT DOCUMENTS

| | | |
|---|---|---|
| EP | 1500977 A1 | 1/2005 |
| JP | 2004125835 A | 4/2004 |

(Continued)

OTHER PUBLICATIONS

Hoo, Ng Wah et al., "The Effect of UPW Quality on Photolithography Defect," Proc. SPIE 7520, Lithography Asia 2009, Dec. 14, 2009, 7 pages, vol. 7520, SPIE, Taipei, Taiwan.

(Continued)

*Primary Examiner* — Anca Eoff
(74) *Attorney, Agent, or Firm* — Slater Matsil, LLP

(57) ABSTRACT

A photoresist with a group which will decompose bonded to a high etching resistance moiety is provided. Alternatively, the group which will decompose can additionally be attached to a re-attachment group that will re-attach to the polymer after the group which will decompose has cleaved from the polymer. The photoresist may also comprise a non-leaving monomer with a cross-linking site and a cross-linking agent.

20 Claims, 9 Drawing Sheets

(56) References Cited

U.S. PATENT DOCUMENTS

| | | |
|---|---|---|
| 6,835,527 B2 | 12/2004 | Takata et al. |
| 6,852,473 B2 | 2/2005 | Roberts et al. |
| 6,872,503 B2 | 3/2005 | Wheland et al. |
| 6,875,554 B2 | 4/2005 | Hatanaka et al. |
| 6,936,400 B2 | 8/2005 | Takasu et al. |
| 6,952,253 B2 | 10/2005 | Lof et al. |
| 6,964,840 B2 | 11/2005 | Nishimura et al. |
| 6,991,888 B2 | 1/2006 | Padmanaban et al. |
| 7,195,860 B2 | 3/2007 | Endo et al. |
| 7,235,348 B2 | 6/2007 | Ho et al. |
| 7,264,918 B2 | 9/2007 | Endo et al. |
| 7,300,747 B2 | 11/2007 | Okazaki et al. |
| 7,312,014 B2 | 12/2007 | Maesawa et al. |
| 7,320,855 B2 | 1/2008 | Huang et al. |
| 7,344,970 B2 | 3/2008 | Forman et al. |
| 7,362,412 B2 | 4/2008 | Holmes et al. |
| 7,393,624 B2 | 7/2008 | Allen et al. |
| 7,432,035 B2 | 10/2008 | Maeda et al. |
| 7,432,042 B2 | 10/2008 | Chang et al. |
| 7,460,206 B2 | 12/2008 | Weissenrieder et al. |
| 7,470,503 B1 | 12/2008 | Brandl |
| 7,582,398 B2 | 9/2009 | Iftime et al. |
| 7,585,612 B2 | 9/2009 | Thackeray et al. |
| 7,595,141 B2 | 9/2009 | Kudo et al. |
| 7,608,386 B2 | 10/2009 | Nozaki et al. |
| 7,648,815 B2 | 1/2010 | Itatani et al. |
| 7,718,541 B2 | 5/2010 | Makiyama et al. |
| 7,733,459 B2 | 6/2010 | Dierichs et al. |
| 7,738,074 B2 | 6/2010 | Streefkerk et al. |
| 7,779,781 B2 | 8/2010 | Mertens et al. |
| 7,824,837 B2 | 11/2010 | Wu et al. |
| 7,846,637 B2 | 12/2010 | Ishizuka et al. |
| 7,879,529 B2 | 2/2011 | Endo et al. |
| 7,919,222 B2 | 4/2011 | Vohra et al. |
| 7,927,779 B2 | 4/2011 | Chang |
| 7,959,141 B2 | 6/2011 | Makino |
| 7,985,534 B2 | 7/2011 | Tsubaki |
| 7,989,578 B2 | 8/2011 | Wu |
| 7,998,655 B2 | 8/2011 | Tsubaki |
| 8,017,304 B2 | 9/2011 | Tarutani et al. |
| 8,071,272 B2 | 12/2011 | Tsubaki |
| 8,088,548 B2 | 1/2012 | Houlihan et al. |
| 8,088,557 B2 | 1/2012 | Tsubaki |
| 8,105,748 B2 | 1/2012 | Ohashi et al. |
| 8,216,767 B2 | 7/2012 | Wang et al. |
| 8,257,901 B2 | 9/2012 | Kim et al. |
| 8,323,870 B2 | 12/2012 | Lee et al. |
| 8,329,387 B2 | 12/2012 | Yao et al. |
| 8,334,338 B2 | 12/2012 | Yoshimura et al. |
| 8,460,856 B2 | 6/2013 | Yeh et al. |
| 8,507,177 B2 | 8/2013 | Wang et al. |
| 8,518,628 B2 | 8/2013 | Chang et al. |
| 8,586,290 B2 | 11/2013 | Wang et al. |
| 8,741,551 B2 | 6/2014 | Wu et al. |
| 8,932,799 B2 | 1/2015 | Wu et al. |
| 9,581,908 B2* | 2/2017 | Wu .................. G03F 7/038 |
| 2001/0044070 A1 | 11/2001 | Uetani et al. |
| 2002/0015826 A1 | 2/2002 | Desmarteau et al. |
| 2002/0051933 A1 | 5/2002 | Kodama et al. |
| 2002/0068237 A1 | 6/2002 | Imai |
| 2002/0155383 A1 | 10/2002 | Fujimori et al. |
| 2003/0022097 A1 | 1/2003 | Malik et al. |
| 2003/0073027 A1 | 4/2003 | Namiki et al. |
| 2003/0079764 A1 | 5/2003 | Hirose et al. |
| 2003/0087179 A1 | 5/2003 | Iwasaki |
| 2003/0175624 A1 | 9/2003 | Nozaki et al. |
| 2003/0215748 A1 | 11/2003 | Thackeray et al. |
| 2003/0224287 A1 | 12/2003 | Fujimori |
| 2003/0235781 A1 | 12/2003 | Shida et al. |
| 2004/0084150 A1 | 5/2004 | George et al. |
| 2004/0096780 A1 | 5/2004 | Nozaki et al. |
| 2004/0161698 A1 | 8/2004 | Kanagasabapathy et al. |
| 2004/0180299 A1 | 9/2004 | Rolland et al. |
| 2005/0134817 A1 | 6/2005 | Nakamura |
| 2005/0145803 A1 | 7/2005 | Hakey et al. |
| 2005/0145821 A1 | 7/2005 | French et al. |
| 2005/0225737 A1 | 10/2005 | Weissenrieder et al. |
| 2005/0266354 A1 | 12/2005 | Li et al. |
| 2005/0287466 A1 | 12/2005 | Miyamoto et al. |
| 2006/0008736 A1 | 1/2006 | Kanda et al. |
| 2006/0105267 A1 | 5/2006 | Khojasteh et al. |
| 2006/0141400 A1 | 6/2006 | Hirayama et al. |
| 2006/0204890 A1 | 9/2006 | Kodama |
| 2006/0246373 A1 | 11/2006 | Wang |
| 2006/0257781 A1 | 11/2006 | Benoit et al. |
| 2006/0257785 A1 | 11/2006 | Johnson |
| 2007/0031755 A1 | 2/2007 | Hirayama et al. |
| 2007/0207406 A1 | 9/2007 | Guerrero et al. |
| 2008/0020289 A1 | 1/2008 | Hatakeyama et al. |
| 2008/0113300 A2 | 5/2008 | Choi et al. |
| 2008/0149135 A1 | 6/2008 | Cho et al. |
| 2008/0160729 A1 | 7/2008 | Krueger et al. |
| 2008/0187860 A1 | 8/2008 | Tsubaki et al. |
| 2008/0241778 A1 | 10/2008 | Kulp |
| 2008/0248331 A1 | 10/2008 | Gallagher et al. |
| 2008/0261150 A1 | 10/2008 | Tsubaki et al. |
| 2009/0042147 A1 | 2/2009 | Tsubaki |
| 2009/0305163 A1 | 12/2009 | Iwashita et al. |
| 2009/0311624 A1 | 12/2009 | Horiguchi et al. |
| 2010/0040971 A1 | 2/2010 | Tarutani et al. |
| 2010/0047710 A1 | 2/2010 | Yamagishi et al. |
| 2010/0068650 A1 | 3/2010 | Nishimura et al. |
| 2010/0086870 A1 | 4/2010 | Ogihara et al. |
| 2010/0099042 A1 | 4/2010 | Ohashi et al. |
| 2010/0239984 A1 | 9/2010 | Tsubaki |
| 2010/0304295 A1 | 12/2010 | Kinsho et al. |
| 2010/0304302 A1 | 12/2010 | Masunaga et al. |
| 2011/0020755 A1 | 1/2011 | Tsubaki |
| 2011/0065878 A1 | 3/2011 | Rhodes et al. |
| 2011/0097670 A1 | 4/2011 | Wang et al. |
| 2011/0250543 A1 | 10/2011 | Tsubaki |
| 2011/0263136 A1 | 10/2011 | Kim et al. |
| 2012/0052687 A1 | 3/2012 | Raghavan et al. |
| 2012/0064725 A1* | 3/2012 | Kinsho ................. G03F 7/091 438/703 |
| 2012/0171616 A1 | 7/2012 | Thackeray et al. |
| 2012/0202158 A1 | 8/2012 | Hatakeyama et al. |
| 2012/0214101 A1 | 8/2012 | Shimizu et al. |
| 2012/0238106 A1 | 9/2012 | Chuang |
| 2012/0282553 A1 | 11/2012 | Kimura et al. |
| 2012/0288794 A1 | 11/2012 | Bae et al. |
| 2012/0308741 A1 | 12/2012 | Kim et al. |
| 2012/0308939 A1 | 12/2012 | Kudo et al. |
| 2013/0045365 A1 | 2/2013 | Kato et al. |
| 2013/0171560 A1 | 7/2013 | Shin et al. |
| 2013/0203000 A1 | 8/2013 | Matsuda et al. |
| 2013/0288180 A1 | 10/2013 | Hatakeyama et al. |
| 2014/0011133 A1 | 1/2014 | Liu et al. |
| 2014/0042090 A1 | 2/2014 | Bell et al. |
| 2014/0045117 A1 | 2/2014 | Yamaguchi et al. |
| 2014/0113236 A1 | 4/2014 | Senzaki et al. |
| 2014/0170563 A1* | 6/2014 | Hatakeyama ............ G03F 7/40 430/285.1 |
| 2015/0086924 A1 | 3/2015 | Wu et al. |
| 2015/0160552 A1 | 6/2015 | Lai et al. |

FOREIGN PATENT DOCUMENTS

| | | |
|---|---|---|
| JP | 2004170871 A | 6/2004 |
| JP | 2006145788 A | 6/2006 |
| JP | 2006178172 A | 7/2006 |
| JP | 2006317794 A | 11/2006 |
| JP | 2010164958 A | 7/2010 |
| JP | 2014115632 A | 6/2014 |
| KR | 100814488 B1 | 3/2008 |
| KR | 20120078672 A | 7/2012 |
| KR | 101207444 B1 | 11/2012 |
| KR | 101207446 B1 | 12/2012 |
| TW | 536661 B | 6/2003 |
| TW | 200831546 A | 8/2008 |
| TW | I336819 B | 2/2011 |
| TW | I341961 B | 5/2011 |
| TW | I343513 B | 6/2011 |
| WO | 2005088397 A2 | 9/2005 |

(56) References Cited

FOREIGN PATENT DOCUMENTS

| WO | 2006054432 A1 | 5/2006 |
|---|---|---|
| WO | 2008140846 A1 | 11/2008 |
| WO | 2012036250 A1 | 3/2012 |
| WO | 2012133257 | 10/2012 |
| WO | 2012169620 A1 | 12/2012 |
| WO | 2013039243 A1 | 3/2013 |

OTHER PUBLICATIONS

Kitano, Junichi et al., "Resist pattern collapse prevention for the sub-90nm node," Microlithography World, May 2004, pp. 18-24, PennWell Publishing Corp.

Kunz, Roderick R., Kunz SPIE Short Course, 21 pages, MIT Lincoln Library, 2002, publisher unknown.

Lau, Aldrich N. K. et al., "New Thermal Cross-Linkers Based on Triazene: Cross-Linking of Fluorinated Polyimides and Aromatic Polymers," Macromolecules, 1992, pp. 7294-7299, vol. 25.

Lin et al. "A Water-Castable, Water-Developable Chemically Amplified Negative-Tone Resist," 1997 Chem. Mater No. 9, vol. 8, pp. 1725-1730.

Reiser, Arnost, Photoreactive Polymers: The Science and Technology of Resists, Feb. 1989, 409 pages, Wiley-Interscience, New York.

Robertson, Stewart et al., "Physical Resist Simulation for a Negative Tone Development Process," 2010 International Symposium on Lithography Extension, Oct. 20-22, 2010, 19 pages.

Sekiguchi, Atsushi et al., "Analysis of Deprotection Reaction in Chemically Amplified Resists Using an Fourier Transform Infrared Spectrometer with an Exposure Tool," Japan J. Appl. Phys., Mar. 2000, pp. 1392-1398, vol. 39, Part 1, No. 3A.

Switkes, M. et al., "Extending optics to 50 nm and beyond with immersion lithography," Journal of Vacuum Science & Technology B: Microelectronics and Nanometer Structures, Nov./Dec. 2003, vol. 21, No. 6., pp. 2794-2799.

Tarutani, Shinji et al., "Process parameter influence to negative tone development process for double patterning," Proc. SPIE 7639, Advances in Resist Materials and Processing Technology XXVII, Mar. 29, 2010, 13 pages, vol. 7639.

Tsvetanova, D. et al., "Degradation of 248 nm Deep UV Photoresist by Ion Implantation," Journal of the Electromechanical Society, Jun. 10, 2011, 10 pages, vol. 158, Issue 8, The Electromechanical Society.

\* cited by examiner

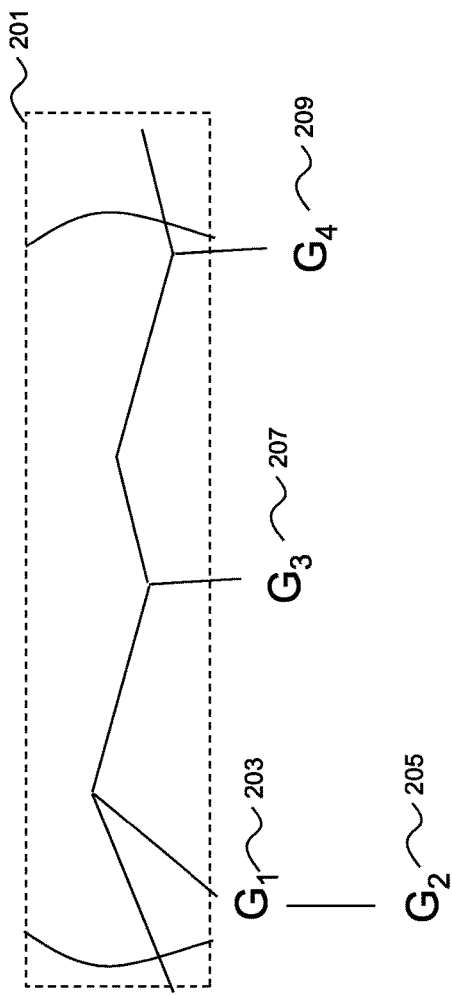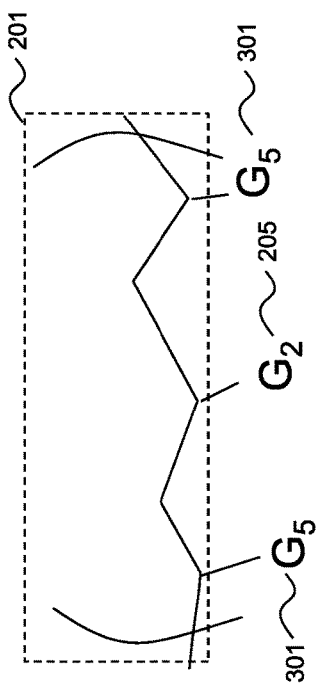
Figure 2
Figure 3

PHOTORESIST AND METHOD

PRIORITY CLAIM AND CROSS-REFERENCE

This application is a continuation of and claims priority to U.S. patent application Ser. No. 14/334,590, filed on Jul. 17, 2014, and entitled "Photoresist and Method," which application claims priority to U.S. Provisional Application No. 61/994,741, filed on May 16, 2014, and entitled "Photoresist and Method," which applications are incorporated herein by reference.

This application is related to the application filed as U.S. patent application Ser. No. 14/334,612 on Jul. 17, 2014, which application is hereby incorporated herein by reference.

BACKGROUND

As consumer devices have gotten smaller and smaller in response to consumer demand, the individual components of these devices have decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface and then exposed to an energy that has itself been patterned. Such an exposure modifies the chemical and physical properties of the exposed regions of the photolithographic material. This modification, along with the lack of modification in regions of the photolithographic material that were not exposed, can be exploited to remove one region without removing the other.

However, as the size of individual devices has decreased, process windows for photolithographic processing have become tighter and tighter. As such, advances in the field of photolithographic processing have been needed in order to keep up the ability to scale down the devices, and further improvements are needed in order to meet the desired design criteria such that the march towards smaller and smaller components may be maintained.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 illustrates a photoresist with a group which will decompose in accordance with some embodiments;

FIG. 3 illustrates a photoresist with cross-linking sites in accordance with some embodiments;

DETAILED DESCRIPTION

Figure 1:
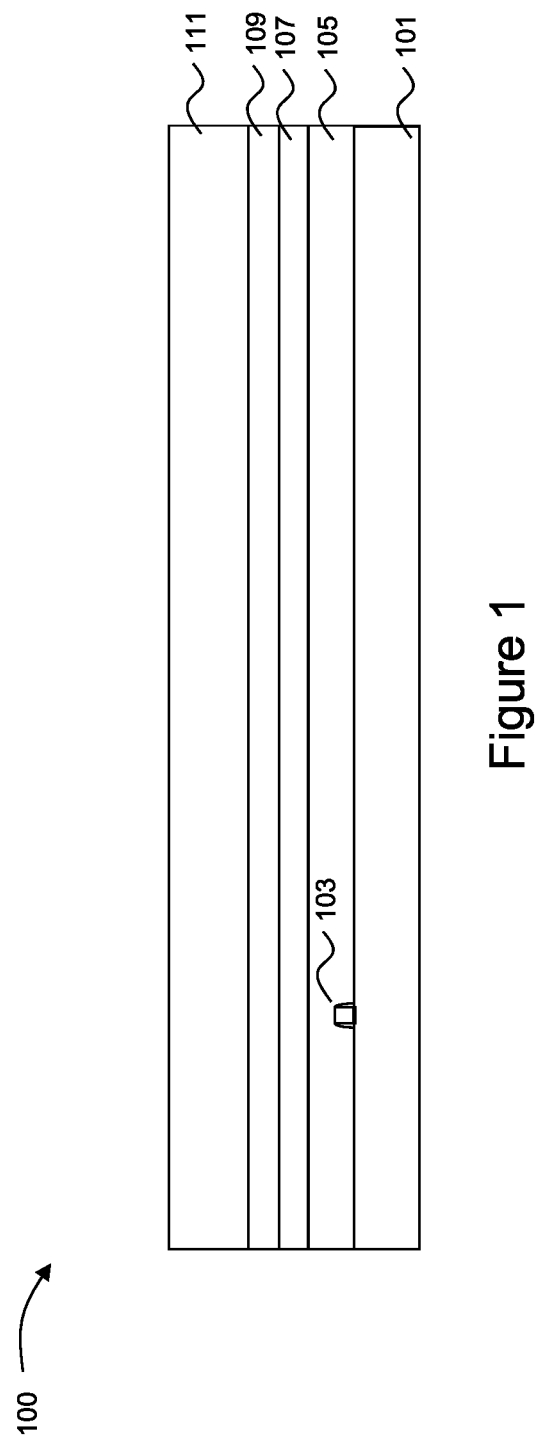
FIG. 1 illustrates a substrate with a layer to be patterned and a photoresist in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference now to FIG. 1, there is shown a semiconductor device 100 with a substrate 101, active devices 103 on the substrate 101, an interlayer dielectric (ILD) layer 105 over the active devices 103, metallization layers 107 over the ILD layer 105, a layer to be patterned 109 over the ILD layer 105, and a photoresist 111 over the layer to be patterned 109. The substrate 101 may be substantially conductive or semiconductive with an electrical resistance of less than $10^3$ ohm-meter and may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The active devices 103 are represented in FIG. 1 as a single transistor. However, as one of skill in the art will recognize, a wide variety of active devices such as capacitors, resistors, inductors and the like may be used to generate the desired structural and functional requirements of the design for the semiconductor device 100. The active devices 103 may be formed using any suitable methods either within or else on the surface of the substrate 101.

The ILD layer 105 may comprise a material such as boron phosphorous silicate glass (BPSG), although any suitable dielectrics may be used for either layer. The ILD layer 105 may be formed using a process such as PECVD, although other processes, such as LPCVD, may alternatively be used. The ILD layer 105 may be formed to a thickness of between about 100 Å and about 3,000 Å.

The metallization layers 107 are formed over the substrate 101, the active devices 103, and the ILD layer 105 and are designed to connect the various active devices 103 to form functional circuitry. While illustrated in FIG. 1 as a single layer, the metallization layers 107 are formed of alternating layers of dielectric and conductive material and may be formed through any suitable process (such as deposition, damascene, dual damascene, etc.). In an embodiment there may be four layers of metallization separated from the substrate 101 by the ILD layer 105, but the precise number of metallization layers 107 is dependent upon the design of the semiconductor device 100.

A layer to be patterned 109 or otherwise processed using the photoresist 111 is formed over the metallization layers 107. The layer to be patterned 109 may be a layer of semiconductor material, an upper layer of the metallization layers 107, or else may be a dielectric layer (such as a passivation layer) formed over the metallization layers 107. In an embodiment in which the layer to be patterned 109 is a semiconductor material, the layer to be patterned 109 may be the substrate 101 without the intervening active devices, metallization layers 107, and dielectric material (an embodiment not separately illustrated in FIG. 1).

Alternatively, in an embodiment in which the layer to be patterned 109 is a metallization layer, the layer to be patterned 109 may be formed of a conductive material using processes similar to the processes used for the metallization layers (e.g., damascene, dual damascene, deposition, etc.). In a particular embodiment the conductive material for the layer to be patterned 109 comprises at least one metal, metal alloy, metal nitride, metal sulfide, metal selenide, metal oxide, or metal silicide. For example, the conductive material can have the formula $MX_a$, where M is a metal and X is nitrogen, selenium, oxygen, or silicon and wherein a is between 0.4 and 2.5. Particular examples include copper, titanium, aluminum, cobalt, ruthenium, titanium nitride, tungsten nitride ($WN_2$), and tantalum nitride, although any suitable material may alternatively be utilized.

In yet another embodiment the layer to be patterned 109 is a dielectric layer with a dielectric constant between about 1 to about 40. In this embodiment the layer to be patterned comprises silicon, a metal oxide, or a metal nitride with a formula of $MX_b$, where M is a metal or silicon, X is nitrogen or oxygen, and b is between about 0.4 and 2.5. In particular examples the dielectric layer for the layer to be patterned 109 may be silicon oxide, silicon nitride, aluminum oxide, hafnium oxide, lanthanum oxide, or the like, formed using such processes as deposition, oxidation, or the like.

However, as one of ordinary skill in the art will recognize, while materials, processes, and other details are described in the embodiments, these details are merely intended to be illustrative of embodiments, and are not intended to be limiting in any fashion. Rather, any suitable layer, made of any suitable material, by any suitable process, and any suitable thickness, may alternatively be used. All such layers are fully intended to be included within the scope of the embodiments.

The photoresist 111 is applied to the layer to be patterned 109. In an embodiment the photoresist 111 includes a polymer resin along with one or more photoactive compounds (PACs) in a solvent. The polymer resin and the PACs within the solvent are applied to the layer to be patterned 109 and a pre-exposure bake is performed in order to heat and drive off the solvent in order to remove the solvent and leave behind the polymer resin and the PACs for exposure.

FIG. 2 illustrates one embodiment of the polymer resin that may be used for the photoresist 111. In this embodiment the polymer resin may comprise a hydrocarbon structure (such as a alicyclic hydrocarbon structure, represented in FIG. 2 within the dashed box 201) that contains one or more high etch resistance moieties (represented in FIG. 2 by the designation $G_1$ labeled 203) that is further bonded to a group which will decompose (represented in FIG. 2 by the designation $G_2$ labeled 205) or otherwise react when mixed with acids, bases, or free radicals generated by the PACs (as further described below). In an embodiment the hydrocarbon structure 201 comprises a repeating unit that forms a skeletal backbone of the polymer resin. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like.

Specific structures which may be utilized for the repeating unit of the hydrocarbon structure 201 include methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxy)ethyl acrylate, cyclohexyl acrylate, benzyl acrylate, 2-alkyl-2-adamantyl (meth)acrylate or dialkyl(1-adamantyl)methyl (meth)acrylate, methyl methacrylate, ethyl methacrylate, n-propyl methacrylate, isopropyl methacrylate, n-butyl methacrylate, isobutyl methacrylate, tert-butyl methacrylate, n-hexyl methacrylate, 2-ethylhexyl methacrylate, acetoxyethyl methacrylate, phenyl methacrylate, 2-hydroxyethyl methacrylate, 2-methoxyethyl methacrylate, 2-ethoxyethyl methacrylate, 2-(2-methoxyethoxy)ethyl methacrylate, cyclohexyl methacrylate, benzyl methacrylate, 3-chloro-2-hydroxypropyl methacrylate, 3-acetoxy-2-hydroxypropyl methacrylate, 3-chloroacetoxy-2-hydroxypropyl methacrylate, butyl crotonate, hexyl crotonate and the like. Examples of the vinyl esters include vinyl acetate, vinyl propionate, vinyl butylate, vinyl methoxyacetate, vinyl benzoate, dimethyl maleate, diethyl maleate, dibutyl maleate, dimethyl fumarate, diethyl fumarate, dibutyl fumarate, dimethyl itaconate, diethyl itaconate, dibutyl itaconate, acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phenyl acrylamide, benzyl acrylamide, methacrylamide, methyl methacrylamide, ethyl methacrylamide, propyl methacrylamide, n-butyl methacrylamide, tert-butyl methacrylamide, cyclohexyl methacrylamide, 2-methoxyethyl methacrylamide, dimethyl methacrylamide, diethyl methacrylamide, phenyl methacrylamide, benzyl methacrylamide, methyl vinyl ether, butyl vinyl ether, hexyl vinyl ether, methoxyethyl vinyl ether, dimethylaminoethyl vinyl ether and the like. Examples of the styrenes include styrene, methyl styrene, dimethyl styrene, trimethyl styrene, ethyl styrene, isopropyl styrene, butyl styrene, methoxy styrene, butoxy styrene, acetoxy styrene, chloro styrene, dichloro styrene, bromo styrene, vinyl methyl benzoate, α-methyl styrene, maleimide, vinylpyridine, vinylpyrrolidone, vinylcarbazole, combinations of these, or the like.

In an embodiment the repeating unit of the hydrocarbon structure 201 may also have either a monocyclic or a polycyclic hydrocarbon structure substituted into it, or else the monocyclic or polycyclic hydrocarbon structure may be the repeating unit, in order to form an alicyclic hydrocarbon structure. Specific examples of monocyclic structures that may be used include bicycloalkane, tricycloalkane, tetracycloalkane, cyclopentane, cyclohexane, or the like. Specific examples of polycyclic structures that may be used include cycloalkane, adamantine, adamantane, norbornane, isobornane, tricyclodecane, tetracycododecane, or the like.

In an embodiment the high etch resistance moieties 203 may comprise a chemical structure that will not cleave from the hydrocarbon backbone 201 while the group which will decompose 205 does cleave from the remainder of the structure. By remaining behind after the group which will decompose 205 cleaves, the high etch resistance moieties 203 can still contribute to the etching resistance of the photoresist 111 after development.

In an embodiment the high etch resistance moiety 203 can be a bulky structure, with greater than about 6 carbon atoms with a linear, cyclic, or branched structure. In particular embodiments the high etch resistance moiety 203 can have one of the following structures:

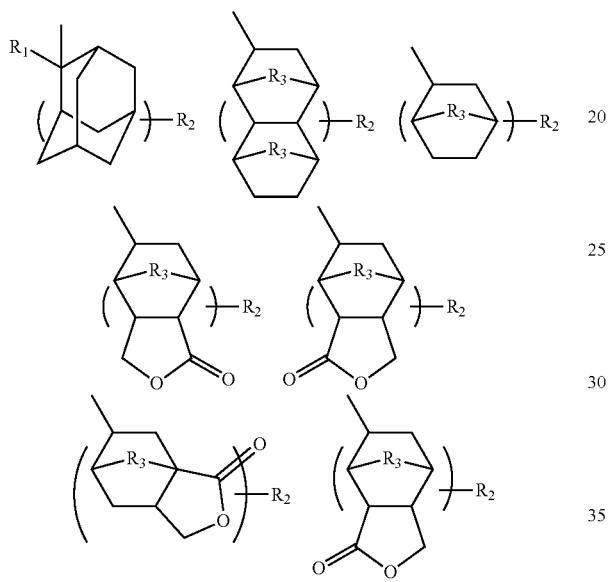

wherein $R_1$ is a methyl group, and ethyl group, a propyl group, an isopropyl group, a butyl group, an isobutyl group, a pentyl group, and isopentyl group, or the like; and $R_3$ is a C1 to C3 alkylene chain.

$R_2$ as described above has one of the following structures:

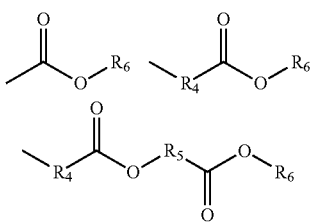

wherein $R_4$ and $R_5$ are C1 to C8 straight or branched alkyl chains such as a methylene group, an ethylene group, a propylene group, a butylene group, a pentylene group, an isopropylene group, an isobutylene group, or the like; and $R_6$ is the group which will decompose 205 (shown already attached to the $R_2$ group).

Attached to the high etch resistance moieties 203 is the group which will decompose 205. The group which will decompose 205 will react with the acids/bases/free radicals generated by exposure of the photoresist 111 (not illustrated in FIG. 2 but illustrated and discussed further below with respect to FIG. 5) and cleave from the high etch resistance moieties 203 to which they are attached. This cleavage will change the solubility of the resin and allow for a suitable developer (not illustrated in FIG. 2 but illustrated and described below with respect to FIG. 7) to separate one portion of the photoresist 111 (e.g., an exposed portion) from another portion of the photoresist 111 (e.g., an unexposed portion).

In an embodiment the group which will decompose 205 that is attached to the high etching resistance moiety 203 has one of the following structures:

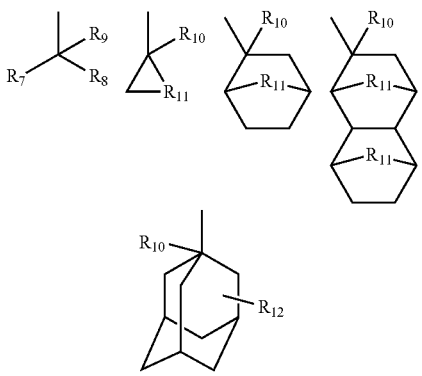

wherein $R_{10}$ is a C1 to C8 straight or branched alkyl chain, such as a methyl group, an ethyl group, a propyl group, an isopropyl group, a butyl group, an isobutyl group, a pentyl group, an isopentyl group, or the like; $R_7$, $R_8$ and $R_9$ are hydrogen or a C1 to C8 straight or branched alkyl chain, such as a methyl group, an ethyl group, a propyl group, an isopropyl group, a butyl group, an isobutyl group, a pentyl group, an isopentyl group, or the like; $R_{11}$ is a $CH_2$, $C_2H_4$, or $C_3H_6$; and $R_{12}$ is $CH_3$, $C_2H_5$, OH, $OCH_3$, $OC_2H_5$, or the like.

In an embodiment the high etch resistance moiety 203 and the group which will decompose 205 may have a loading on the hydrocarbon backbone (the number of sites available on the hydrocarbon backbone to attach groups) of between about 1% and about 10%. However, such a loading is intended to only be illustrative and is not intended to be limiting to the current embodiments. Rather, any suitable loading of the high etch resistance moiety 203 and the group which will decompose 205 may be utilized in an effort to reduce the shrinkage of the photoresist 111.

In an embodiment the polymer resin may optionally also comprise other groups attached to the hydrocarbon structure 201 that help to improve a variety of properties of the polymerizable resin. For example, inclusion of a lactone group (represented in FIG. 2 by the designation $G_3$ labeled 207) to the hydrocarbon structure 201 assists to reduce the amount of line edge roughness after the photoresist 111 has been developed, thereby helping to reduce the number of defects that occur during development. In an embodiment the lactone groups 207 may include rings having five to seven members, although any suitable lactone structure may alternatively be used for the lactone group 207, and the lactone group 207 may have a loading on the hydrocarbon backbone of between about 30% and about 70%.

In particular embodiments the lactone group 207 may comprise the following structures:

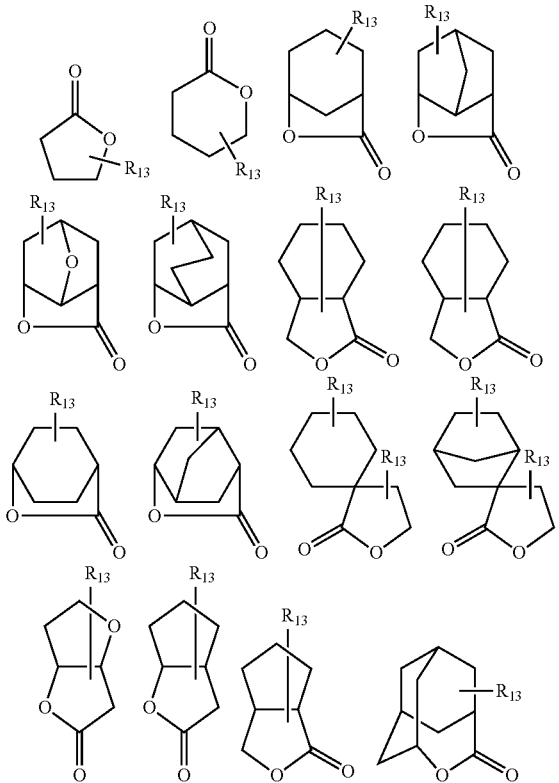

wherein $R_{13}$ represents a C1-C8 alkyl group, a C4-C7 cycloalkyl group, a C1-C8 alkoxy group, a C2-C8 alkoxycarbonyl group, a carboxyl group, a halogen atom, a hydroxyl group, a cyano group, or a group which will decompose. Further, the lactone group may not have the $R_{13}$ group, or may have multiple $R_{13}$ groups bound together, wherein each of the $R_{13}$ groups may be the same or different from each other, in either a linear or cyclic structure.

The polymer resin may also optionally comprise groups that can assist in increasing the adhesiveness of the photoresist 111 (represented in FIG. 2 by the designation $G_4$ labeled 209) to underlying structures (e.g., the layer to be patterned 109). In an embodiment polar groups may be used to help increase the adhesiveness, and polar groups that may be used in this embodiment include hydroxyl groups, cyano groups, or the like, although any suitable polar group may alternatively be utilized. In an embodiment the group which assists in increasing the adhesiveness 209 may have a loading on the hydrocarbon backbone of less than about 20%.

The various groups desired within the polymer resin are then combined to form the polymer resin. In a particular embodiment, the various monomers with the groups, such as the monomers with the group which will decompose 205 attached to the high etching resistance moiety 203, a monomer with the adhesive group 209, and the monomer with the lactone group 207, and any other desired monomers will be polymerized with one another using, e.g., a radical polymerization, to form a polymer structure with the carbon chain backbone for the polymer resin.

FIG. 3 illustrates another embodiment of the photoresist resin which uses non-leaving monomers with cross-linking sites (represented in FIG. 3 by the designation $G_5$ labeled 301) to at least partially prevent the group which will decompose 205 from leaving after the group which will decompose 205 has been cleaved from the remainder of the resin. By preventing the group which will decompose 205 from physically leaving the photoresist 111 after it has been cleaved, there will be a reduced shrinkage of the photoresist 111, allowing for a greater precision within the process.

In an embodiment the non-leaving group with the cross-linking site 301 will work together with a cross-linking agent (not illustrated in FIG. 3 but described further below) in order to bond one polymer of the resin within the photoresist 111 to another polymer of the resin within the photoresist 111. By cross-linking the various polymers, the overall film density of the photoresist 111 will increase, which will help trap and prevent the group which will decompose 205 from leaving the photoresist 111 after exposure.

In a particular embodiment the non-leaving group with the cross-linking site 301 has one of the following structures:

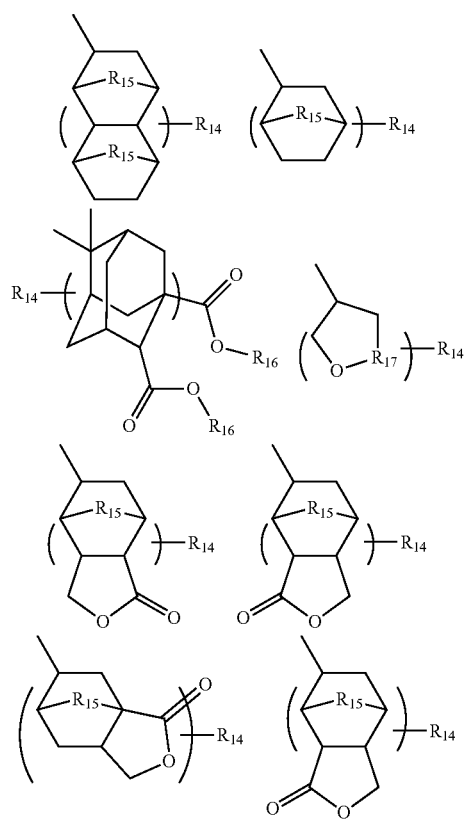

wherein $R_{14}$ is H, OH, $OCH_3$, $OC_2H_5$, $OC_3H_7$, $OC_4H_9$, epoxy, $CH_2OCH_3$, $CH_2OC_2H_5$, $CH_2OC_3H_7$, $CH_2OC_4H_9$, $CH_2CH_2OCH_3$, $CH_2CH_2OC_2H_5$, $CH_2CH_2OC_3H_7$, $CH_2CH_2OC_4H_9$, and wherein $R_{15}$ and $R_{16}$ are independently a C1 to C5 alkylene chain such as methyl, ethyl, propyl, butyl, pentyl, or the like, and wherein R17 is $CH_2$, $C_2H_4$, $C_3H_6$, CO, or the like.

In this embodiment in which the non-leaving group with the cross-linking site 301 is utilized together with the cross-linking agent (described further below), the group which will decompose 205 may be structured so as to be trapped by the increased density. In particular embodiments, the group which will decompose 205 has one of the following structures (which may overlap with the structures listed above):

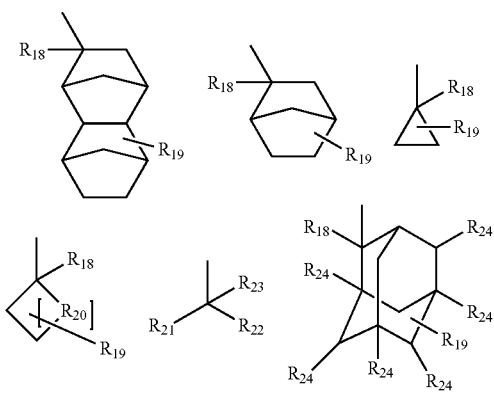

wherein $R_{18}$, $R_{21}$, $R_{22}$ and $R_{23}$ are hydrogen, a methyl group, an ethyl group, a propyl group, an isopropyl group, a butyl group, an isobutyl group, an isopentyl group, or the like; $R_{20}$ is a C1 to C5 alkyl chain (such as a methyl group, an ethyl group, a propyl group, a butyl group, a pentyl group, or the like), $R_{24}$ is a methyl group, an ethyl group, a propyl group, an isopropyl group, a butyl group, an isobutyl group, a pentyl group, an isopentyl group, a hydroxy group, ether, $OCH_3$, $OCH_2CH_3$, $OCH_2CH_2CH_3$, CN, or the like; and $R_{19}$ is an epoxy group, an alcohol group, an amine group, a carboxylic acid group, or the like.

In an embodiment the non-leaving group with the cross-linking site 301 may have a loading on the hydrocarbon backbone of between about 10% and about 50%. However, such a loading is intended to only be illustrative and is not intended to be limiting to the current embodiments. Rather, any suitable loading of the non-leaving group with the cross-linking site 301 may be utilized in an effort to reduce the shrinkage of the photoresist 111.

Additionally, the non-leaving group with the cross-linking site 301 may be utilized along with the high etching resistance moiety 203 and the group which will decompose 205 as described above with respect to FIG. 2. By using both of these embodiments together, shrinkage can reduced even further. In this embodiment the non-leaving group with the cross-linking site 301 have a loading of between about 5% and about 50%, such as about 30%, while the high etching resistance moiety 203 and the group which will decompose 205 have a loading of between about 5% and about 50%, such as about 10%. However, any suitable loading may alternatively be utilized.

Returning now to FIG. 1, additionally, the photoresist 111 also comprises one or more PACs. The PACs may be photoactive components such as photoacid generators, photobase generators, free-radical generators, or the like, and the PACs may be positive-acting or negative-acting. In an embodiment in which the PACs are a photoacid generator, the PACs may comprise halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenerated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, suitable combinations of these, and the like.

Specific examples of photoacid generators that may be used include α-(trifluoromethylsulfonyloxy)-bicyclo[2.2.1] hept-5-ene-2,3-dicarbo-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl) sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl) triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, and the like.

In an embodiment in which the PACs are a free-radical generator, the PACs may comprise n-phenylglycine, aromatic ketones such as benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis(dimethylamino)benzo-phenone, p,p'-bis(diethylamino)-benzophenone, anthraquinone, 2-ethylanthraquinone, naphthaquinone and phenanthraquinone, benzoins such as benzoin, benzoinmethylether, benzoinethylether, benzoinisopropylether, benzoin-n-butylether, benzoin-phenylether, methylbenzoin and ethybenzoin, benzyl derivatives such as dibenzyl, benzyldiphenyldisulfide and benzyldimethylketal, acridine derivatives such as 9-phenylacridine and 1,7-bis(9-acridinyl)heptane, thioxanthones such as 2-chlorothioxanthone, 2-methylthioxanthone, 2,4-diethylthioxanthone, 2,4-dimethylthioxanthone and 2-isopropylthioxanthone, acetophenones such as 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone, 2,4,5-triarylimidazole dimers such as 2-(o-chlorophenyl)-4,5-diphenylimidazole dimer, 2-(o-chlorophenyl)-4,5-di-(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimmer, suitable combinations of these, or the like.

In an embodiment in which the PACs are a photobase generator, the PACs may comprise quaternary ammonium dithiocarbamates, a aminoketones, oxime-urethane containing molecules such as dibenzophenoneoxime hexamethylene diurethan, ammonium tetraorganylborate salts, and N-(2-nitrobenzyloxycarbonyl) cyclic amines, suitable combinations of these, or the like. However, as one of ordinary skill in the art will recognize, the chemical compounds listed herein are merely intended as illustrated examples of the PACs and are not intended to limit the embodiments to only those PACs specifically described. Rather, any suitable PAC, such as a thermal acid generator, may alternatively be utilized, and all such PACs are fully intended to be included within the scope of the present embodiments.

The individual components of the photoresist 111 may be placed into a solvent in order to aid in the mixing and placement of the photoresist 111. To aid in the mixing and placement of the photoresist 111, the solvent is chosen at least in part based upon the materials chosen for the polymer resin as well as the PACs. In particular, the solvent is chosen such that the polymer resin and the PACs can be evenly dissolved into the solvent and dispensed upon the layer to be patterned 109.

In an embodiment the solvent may be an organic solvent, and may comprise any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, ethylene glycol alkyl ether acetates, diethylene glycols, propylene glycol alkyl ether acetates, alkylene glycol alkyl ether esters, alkylene glycol monoalkyl esters, or the like.

Specific examples of materials that may be used as the solvent for the photoresist 111 include acetone, methanol, ethanol, toluene, xylene, 4-hydroxy-4-methyl-2-pentatone, tetrahydrofuran, methyl ethyl ketone, cyclohexanone, cyclohexanon, methyl isoamyl ketone, 2-heptanone, ethylene glycol, ethylene glycol monoacetate, ethylene glycol dimethyl ether, ethylene glycol methylethyl ether, ethylene glycol monoethyl ether, methyl cellosolve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, diethylene glycol monoethyl ether, diethylene glycol monobutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, ethyl acetate, butyl acetate, n-butyl acetate, methyl lactate and ethyl lactate, propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monobutyl ether acetate, propylene glycol monomethyl ether propionate, propylene glycol monoethyl ether propionate, proplylene glycol methyl ether adcetate, proplylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, propyl lactate, and butyl lactate, ethyl 3-ethoxypropionate, methyl 3-methoxypropionate, methyl 3-ethoxypropionate, and ethyl 3-methoxypropionate, β-propiolactone, β-butyrolactone, γ-butyrolactone, α-methyl-γ-butyrolactone, β-methyl-γ-butyrolactone, γ-valerolactone, γ-caprolactone, γ-octanoic lactone, α-hydroxy-γ-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, pylene carbonate, vinylene carbonate, ethylene carbonate, and butylene carbonate, acetate-2-methoxyethyl, acetate-2-ethoxyethyl, acetate-2-(2-ethoxyethoxy)ethyl, acetate-3-methoxy-3-methylbutyl, acetate-1-methoxy-2-propyl, dipropylene glycol, monomethylether, monoethylether, monopropylether, monobutylehter, monophenylether, dipropylene glycol mono acetate, dioxane, etheyl lactate, methyl acetate, ethyl acetate, butyl acetate, methyl puruvate, ethyl puruvate, propyl pyruvate, methyl methoxypropionate, ethyl ethoxypropionate, n-methylpyrrolidone (NMP), 2-methoxyethyl ether (diglyme), ethylene glycol monom-ethyl ether, propylene glycol monomethyl ether; methyl proponiate, ethyl proponiate and ethyl ethoxy proponiate, methylethyl ketone, cyclohexanone, 2-heptanone, carbon dioxide, cyclopentatone, cyclohexanone, ethyl 3-ethocypropionate, propylene glycol methyl ether acetate (PGMEA), methylene cellosolve, butyle acetate, and 2-ethoxyethanol, N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, or the like.

However, as one of ordinary skill in the art will recognize, the materials listed and described above as examples of materials that may be utilized for the solvent component of the photoresist 111 are merely illustrative and are not intended to limit the embodiments. Rather, any suitable material that may dissolve the polymer resin and the PACs may alternatively be utilized to help mix and apply the photoresist 111. All such materials are fully intended to be included within the scope of the embodiments.

Additionally, while individual ones of the above described materials may be used as the solvent for the photoresist 111, in alternative embodiments more than one of the above described materials may be utilized. For example, the solvent may comprise a combination mixture of two or more of the materials described. All such combinations are fully intended to be included within the scope of the embodiments.

Optionally, a cross-linking agent may also be added to the photoresist 111. The cross-linking agent reacts with the polymer resin within the photoresist 111 after exposure, assisting in increasing the cross-linking density of the photoresist 111, which helps to improve the resist pattern and resistance to dry etching. In an embodiment the cross-linking agent may be an melamine based agent, a urea based agent, ethylene urea based agent, propylene urea based agent, glycoluril based agent, an aliphatic cyclic hydrocarbon having a hydroxyl group, a hydroxyalkyl group, or a combination of these, oxygen containing derivatives of the aliphatic cyclic hydrocarbon, glycoluril compounds, etherified amino resins, combinations of these, or the like.

Specific examples of materials that may be utilized as a cross-linking agent include tetramethylol glycouril (TMGA) and its derivatives, melamine, acetoguanamine, benzoguanamine, urea, ethylene urea, or glycoluril with formaldehyde, glycoluril with a combination of formaldehyde and a lower alcohol, hexamethoxymethylmelamine, bismethoxymethylurea, bismethoxymethylbismethoxyethylene urea, tetramethoxymethylglycoluril, and tetrabutoxymethylglycoluril, mono-, di-, tri-, or tetra-hydroxymethylated glycoluril, mono-, di-, tri-, and/or tetra-methoxymethylated glycoluril, mono-, di-, tri-, and/or tetra-ethoxymethylated glycoluril, mono-, di-, tri-, and/or tetra-propoxymethylated glycoluril, and mono-, di-, tri-, and/or tetra-butoxymethylated glycoluril, 2,3-dihydroxy-5-hydroxymethylnorbornane, 2-hydroy-5,6-bis(hydroxymethyl)norbornane, cyclohexanedimethanol, 3,4,8(or 9)-trihydroxytricyclodecane, 2-methyl-2-adamantanol, 1,4-dioxane-2,3-diol and 1,3,5-trihydroxycyclohexane, tetramethoxymethyl glycoluril, methylpropyltetramethoxymethyl glycoluril, and methylphenyltetramethoxymethylglycoluril, 2,6-bis(hydroxymethyl) p-cresol, N-methoxymethyl- or N-butoxymethyl-melamine. Additionally, compounds obtained by reacting formaldehyde, or formaldehyde and lower alcohols with amino group-containing compounds, such as melamine, acetoguanamine, benzoguanamine, urea, ethylene urea and glycoluril, and substituting the hydrogen atoms of the amino group with hydroxymethyl group or lower alkoxymethyl group, examples being hexamethoxymethylmelamine, bismethoxymethyl urea, bismethoxymethylbismethoxyethylene urea, tetramethoxymethyl glycoluril and tetrabutoxymethyl glycoluril, copolymers of 3-chloro-2-hydroxypropyl methacrylate and methacrylic acid, copolymers of 3-chloro-2-hydroxypropyl methacrylate and cyclohexyl methacrylate and methacrylic acid, copolymers of 3-chloro-2-hydroxypropyl methacrylate and benzyl methacrylate and methacrylic acid, bisphenol A-di(3-chloro-2-hydroxypropyl) ether, poly(3-chloro-2-hydroxypro-pyl)ether of a phenol novolak resin, pentaerythritol tetra(3-chloro-2-hydroxypropyl)ether, trimethylolmethane tri(3-chloro-2-hydroxypropyl)ether phenol, bisphenol A-di(3-acetoxy-2-hydroxypropyl)ether, poly(3-acetoxy-2-hydroxypropyl)ether of a phenol novolak resin, pentaerythritol tetra(3-acetoxy-2-hydroxypropyl)ether, pentaerythritol poly(3-chloroacetoxy-2-hydroxypropyl)ether, trimethylolmethane tri(3-acetoxy-2-hydroxypropyl)ether, combinations of these, or the like.

Additionally, in the embodiment described above with respect to FIG. 3, in which the non-leaving group with the cross-linking site 301 is utilized with the cross-linking agent to trap the group which will decompose 205, the cross-linking agent has one of the following structures:

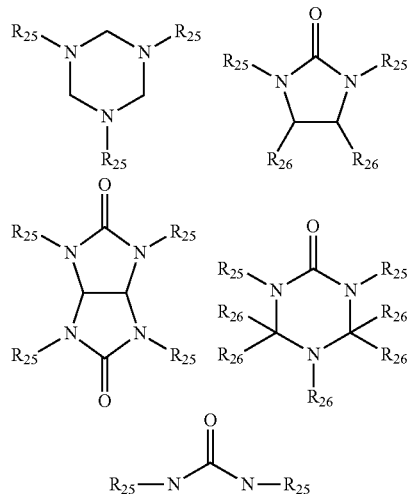

wherein $R_{25}$ is hydrogen, epoxy, $CH_2OCH_3$, $CH_2OC_2H_5$, $CH_2OC_3H_7$, $CH_2OC_4H_9$, $CH_2CH_2OCH_3$, $CH_2CH_2OC_2H_5$, $CH_2CH_2OC_3H_7$, $CH_2CH_2OC_4H_9$, and wherein R26 is a C1 to C4 carbon chain.

Figure 4:
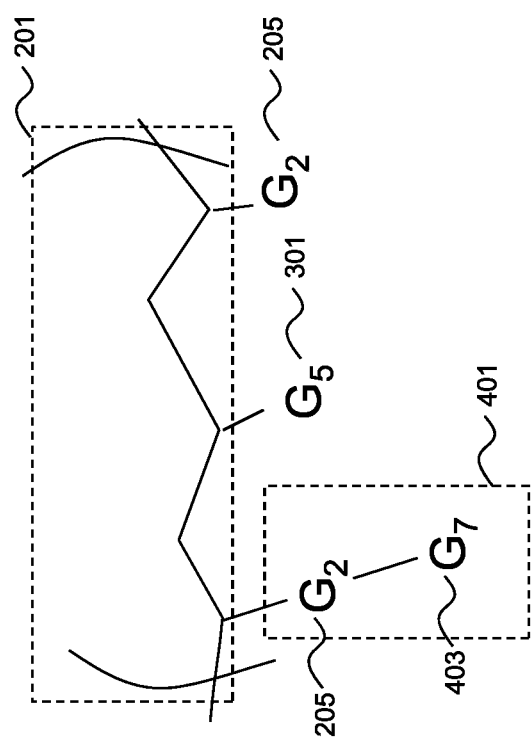
FIG. 4 illustrates a photoresist with a re-attaching group which will decompose in accordance with some embodiments.

FIG. 4 illustrates another embodiment in which a non-leaving group which will decompose (represented in FIG. 4 by the dashed box labeled 401) is attached directly to the hydrocarbon backbone 201 (e.g., without being bonded to the high etch resistance moieties 203) but in which the non-leaving group which will decompose 401 has a structure which allows it to cross-link back to one of the non-leaving groups with the cross-linking site 301 after being cleaved during the exposure and post-exposure baking process. By cleaving, the group which will decompose 205 within the non-leaving group which will decompose 401 will change the solubility of the resin, but by reattaching to the hydrocarbon backbone 201 the group which will decompose 205 will remain with the polymer resin, allowing the process to avoid shrinkage or other losses due to the removal of the group which will decompose 205.

In this embodiment the non-leaving group which will decompose 401 may be similar to the group which will decompose 205 (described above with respect to FIG. 2), but which has been modified to be bonded to a re-attachment group (represented in FIG. 4 by the designation $G_7$ labeled 403). In an embodiment the re-attachment group 403 is H, OH, $OCH_3$, $OC_2H_5$, $OC_3H_7$, $OC_4H_9$, epoxy, $CH_2OCH_3$, $CH_2OC_2H_5$, $CH_2OC_3H_7$, $CH_2OC_4H_9$, $CH_2CH_2OCH_3$, $CH_2CH_2OC_2H_5$, $CH_2CH_2OC_3H_7$, $CH_2CH_2OC_4H_9$, or the like.

In addition to the polymer resins, the PACs, the solvents, and the cross-linking agents, the photoresist 111 may also include a number of other additives that will assist the photoresist 111 obtain the highest resolution. For example, the photoresist 111 may also include surfactants in order to help improve the ability of the photoresist 111 to coat the surface on which it is applied. In an embodiment the surfactants may include nonionic surfactants, polymers having fluorinated aliphatic groups, surfactants that contain at least one fluorine atom and/or at least one silicon atom, polyoxyethylene alkyl ethers, polyoxyethylene alkyl aryl ethers, polyoxyethylene-polyoxypropylene block copolymers, sorbitan fatty acid esters, polyoxyethylene sorbitan fatty acid esters.

Specific examples of materials that may be used as surfactants include polyoxyethylene lauryl ether, polyoxyethylene stearyl ether, polyoxyethylene cetyl ether, polyoxyethylene oleyl ether, polyoxyethylene octyl phenol ether, polyoxyethylene nonyl phenol ether, sorbitan monolaurate, sorbitan monopalmitate, sorbitan mono stearate, sorbitan monooleate, sorbitan trioleate, sorbitan tristearate, polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, polyethylene glycol distearate, polyethylene glycol dilaurate, polyethylene glycol, polypropylene glycol, polyoxyethylenestearyl ether and polyoxyethylene cetyl ether; fluorine containing cationic surfactants, fluorine containing nonionic surfactants, fluorine containing anionic surfactants, cationic surfactants and anionic surfactants, combinations of these, or the like.

Another additive that may be added to the photoresist 111 is a quencher, which may be utilized to inhibit diffusion of the generated acids/bases/free radicals within the photoresist 111, which helps the resist pattern configuration as well as to improve the stability of the photoresist 111 over time. In an embodiment the quencher is an amine such as a second lower aliphatic amine, a tertiary lower aliphatic amine, or the like. Specific examples of amines that may be used include trimethylamine, diethylamine, triethylamine, di-n- propylamine, tri-n-propylamine, tripentylamine, diethanolamine, and triethanolamine, alkanolamine, combinations of these, or the like.

Alternatively, an organic acid may be utilized as the quencher. Specific embodiments of organic acids that may be utilized include malonic acid, citric acid, malic acid, succinic acid, benzoic acid, salicylic acid, phosphorous oxo acid and its derivatives such as phosphoric acid and derivatives thereof such as its esters, such as phosphoric acid, phosphoric acid di-n-butyl ester and phosphoric acid diphenyl ester; phosphonic acid and derivatives thereof such as its ester, such as phosphonic acid, phosphonic acid dimethyl ester, phosphonic acid di-n-butyl ester, phenylphosphonic acid, phosphonic acid diphenyl ester, and phosphonic acid dibenzyl ester; and phosphinic acid and derivatives thereof such as its esters, including phosphinic acid and phenylphosphinic acid.

Another additive that may be added to the photoresist 111 is a stabilizer, which assists in preventing undesired diffusion of the acids generated during exposure of the photoresist 111. In an embodiment the stabilizer may include nitrogenous compounds such as aliphatic primary, secondary, and tertiary amines, cyclic amines such as piperidines, pyrrolidines, morpholines, aromatic heterocycles such as pyridines, pyrimidines, purines, imines such as diazabicycloundecene, guanidines, imides, amides, and others. Alternatively, ammonium salts may also be used for the stabilizer, including ammonium, primary, secondary, tertiary, and quaternary alkyl- and arylammonium salts of alkoxides including hydroxide, phenolates, carboxylates, aryl and alkyl sulfonates, sulfonamides, and others. Other cationic nitrogenous compounds including pyridinium salts and salts of other heterocyclic nitrogenous compounds with anions such as alkoxides including hydroxide, phenolates, carboxylates, aryl and alkyl sulfonates, sulfonamides, and the like may also be employed.

Yet another additive that may be added to the photoresist 111 may be a dissolution inhibitor in order to help control dissolution of the photoresist 111 during development. In an embodiment bile-salt esters may be utilized as the dissolution inhibitor. Specific examples of materials that may be utilized include cholic acid (IV), deoxycholic acid (V), lithocholic acid (VI), t-butyl deoxycholate (VII), t-butyl lithocholate (VIII), and t-butyl-3-α-acetyl lithocholate (IX).

Another additive that may be added to the photoresist 111 may be a plasticizer. Plasticizers may be used to reduce delamination and cracking between the photoresist 111 and underlying layers (e.g., the layer to be patterned 109) and may comprise monomeric, oligomeric, and polymeric plasticizers such as oligo- and polyethyleneglycol ethers, cycloaliphatic esters, and non-acid reactive steroidally-derived materials. Specific examples of materials that may be used for the plasticizer include dioctyl phthalate, didodecyl phthalate, triethylene glycol dicaprylate, dimethyl glycol phthalate, tricresyl phosphate, dioctyl adipate, dibutyl sebacate, triacetyl glycerine and the like.

Adhesion additives may also be added to the photoresist 111 in order to promote adhesion between the photoresist 111 and an underlying layer upon which the photoresist 111 has been applied (e.g., the layer to be patterned 109). In an embodiment the adhesion additives include a silane compound with at least one reactive substituent such as a carboxyl group, a methacryloyl group, an isocyanate group and/or an epoxy group. Specific examples of the adhesion components include trimethoxysilyl benzoic acid, γ-methacryloxypropyl trimethoxy silane, vinyltriacetoxysilane, vinyltrimethoxysilane, γ-isocyanatepropyl triethoxy silane, γ-glycidoxypropyl trimethoxy silane, β-(3,4-epoxycyclohexyl)ethyl trimethoxy silane, benzimidazoles and polybenzimidazoles, a lower hydroxyalkyl substituted pyridine derivative, a nitrogen heterocyclic compound, urea, thiourea, 8-oxyquinoline, 4-hydroxypteridine and derivatives, 1,10-phenanthroline and derivatives, 2,2'-bipyridine and derivatives, benzotriazoles; organophosphorus compounds, phenylenediamine compounds, 2-amino-1-phenylethanol, N-phenylethanolamine, N-ethyldiethanolamine, N-ethylethanolamine and derivatives, benzothiazole, and a benzothiazoleamine salt having a cyclohexyl ring and a morpholine ring, 3-glycidoxypropyltrimethoxysilane, 3-glycidoxypropyltriethoxysilane, 3-mercaptopropyltrimethoxysilane, 3-mercaptopropyltriethoxysilane, 3-methacryloyloxypropyltrimethoxysilane, vinyl trimethoxysilane, combinations of these, or the like.

Surface leveling agents may additionally be added to the photoresist 111 in order to assist a top surface of the photoresist 111 to be level so that impinging light will not be adversely modified by an unlevel surface. In an embodiment surface leveling agents may include fluoroaliphatic esters, hydroxyl terminated fluorinated polyethers, fluorinated ethylene glycol polymers, silicones, acrylic polymer leveling agents, combinations of these, or the like.

In an embodiment the polymer resin and the PACs, along with any desired additives or other agents, are added to the solvent for application. Once added, the mixture is then mixed in order to achieve an even composition throughout the photoresist 111 in order to ensure that there are no defects caused by an uneven mixing or non-constant composition of the photoresist 111. Once mixed together, the photoresist 111 may either be stored prior to its usage or else used immediately.

Once ready, the photoresist 111 may be utilized by initially applying the photoresist 111 onto the layer to be patterned 109. The photoresist 111 may be applied to the layer to be patterned 109 so that the photoresist 111 coats an upper exposed surface of the layer to be patterned 109, and may be applied using a process such as a spin-on coating process, a dip coating method, an air-knife coating method, a curtain coating method, a wire-bar coating method, a gravure coating method, a lamination method, an extrusion coating method, combinations of these, or the like. In an embodiment the photoresist 111 may be applied such that it has a thickness over the surface of the layer to be patterned 109 of between about 10 nm and about 300 nm, such as about 150 nm.

Once the photoresist 111 has been applied to the layer to be patterned 109, a pre-bake of the photoresist 111 is performed in order to cure and dry the photoresist 111 prior to exposure to finish the application of the photoresist 111. The curing and drying of the photoresist 111 removes the solvent component while leaving behind the polymer resin, the PACs, cross-linking agents, and the other chosen additives. In an embodiment the pre-bake may be performed at a temperature suitable to evaporate the solvent, such as between about 40° C. and 150° C., although the precise temperature depends upon the materials chosen for the photoresist 111. The pre-bake is performed for a time sufficient to cure and dry the photoresist 111, such as between about 10 seconds to about 5 minutes, such as about 90 seconds.

Figure 5:
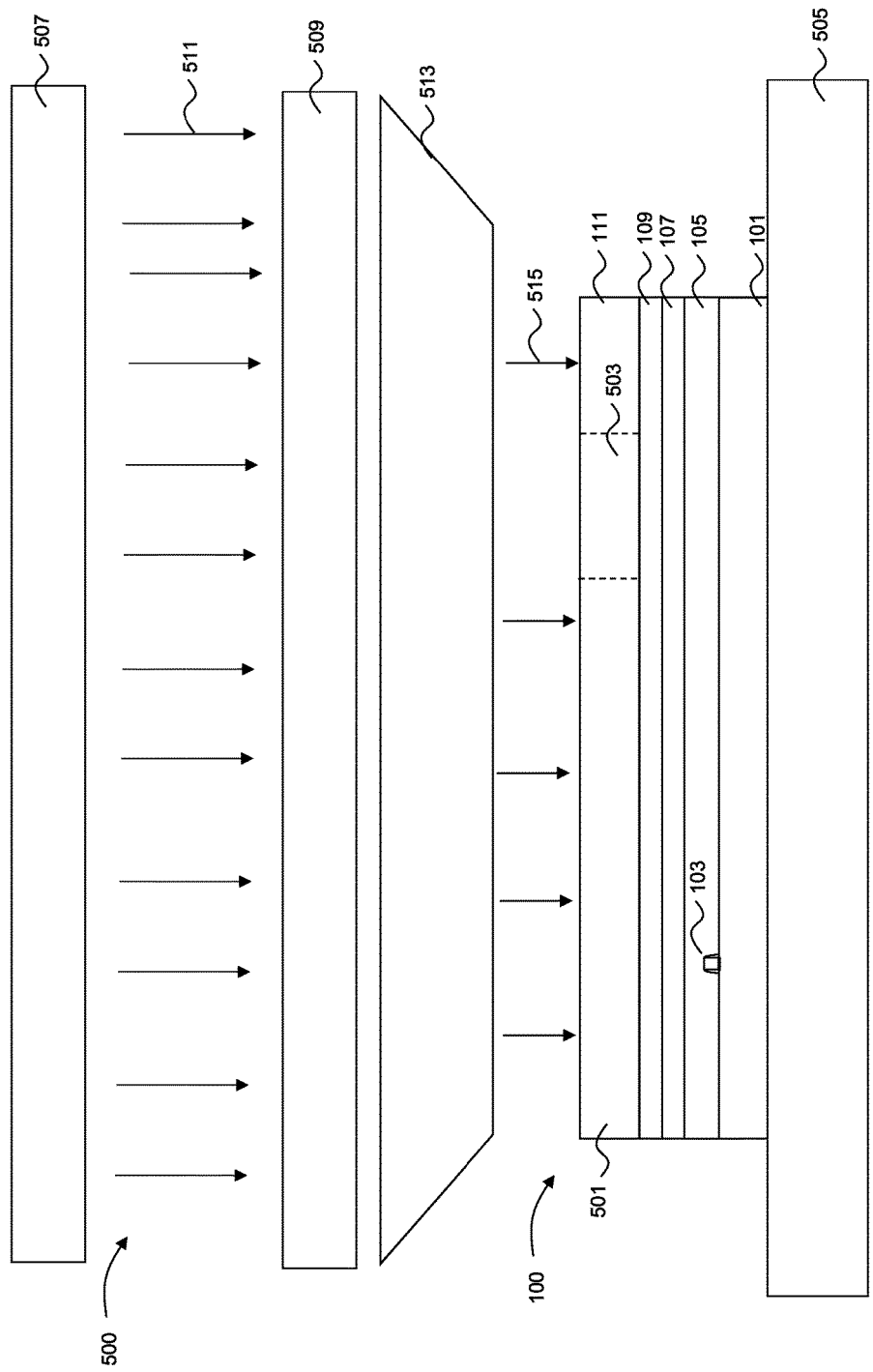
FIG. 5 illustrates an exposure of the photoresist in accordance with some embodiments.

FIG. 5 illustrates an exposure of the photoresist 111 to form an exposed region 501 and an unexposed region 503 within the photoresist 111. In an embodiment the exposure may be initiated by placing the semiconductor device 100 and the photoresist 111, once cured and dried, into an imaging device 500 for exposure. The imaging device 500 may comprise a support plate 505, an energy source 507, a patterned mask 509 between the support plate 505 and the energy source 507, and optics 513. In an embodiment the support plate 505 is a surface to which the semiconductor device 100 and the photoresist 111 may be placed or attached to and which provides support and control to the substrate 101 during exposure of the photoresist 111. Additionally, the support plate 505 may be movable along one or more axes, as well as providing any desired heating or cooling to the substrate 101 and photoresist 111 in order to prevent temperature gradients from affecting the exposure process.

In an embodiment the energy source 507 supplies energy 511 such as light to the photoresist 111 in order to induce a reaction of the PACs, which in turn reacts with the polymer resin to chemically alter those portions of the photoresist 111 to which the energy 511 impinges. In an embodiment the energy 511 may be electromagnetic radiation, such as g-rays (with a wavelength of about 436 nm), i-rays (with a wavelength of about 365 nm), ultraviolet radiation, far ultraviolet radiation, extreme ultraviolet radiation, x-rays, electron beams, or the like. The energy source 507 may be a source of the electromagnetic radiation, and may be a KrF excimer laser light (with a wavelength of 248 nm), an ArF excimer laser light (with a wavelength of 193 nm), a F2 excimer laser light (with a wavelength of 157 nm), or the like, although any other suitable source of energy 511, such as mercury vapor lamps, xenon lamps, carbon arc lamps or the like, may alternatively be utilized.

The patterned mask 509 is located between the energy source 507 and the photoresist 111 in order to block portions of the energy 511 to form a patterned energy 515 prior to the energy 511 actually impinging upon the photoresist 111. In an embodiment the patterned mask 509 may comprise a series of layers (e.g., substrate, absorbance layers, anti-reflective coating layers, shielding layers, etc.) to reflect, absorb, or otherwise block portions of the energy 511 from reaching those portions of the photoresist 111 which are not desired to be illuminated. The desired pattern may be formed in the patterned mask 509 by forming openings through the patterned mask 509 in the desired shape of illumination.

Optics (represented in FIG. 5 by the trapezoid labeled 513) may be used to concentrate, expand, reflect, or otherwise control the energy 511 as it leaves the energy source 507, is patterned by the patterned mask 509, and is directed towards the photoresist 111. In an embodiment the optics 513 comprise one or more lenses, mirrors, filters, combinations of these, or the like to control the energy 511 along its path. Additionally, while the optics 513 are illustrated in FIG. 5 as being between the patterned mask 509 and the photoresist 111, elements of the optics 513 (e.g., individual lenses, mirrors, etc.) may also be located at any location between the energy source 507 (where the energy 511 is generated) and the photoresist 111.

In an embodiment the semiconductor device 100 with the photoresist 111 is placed on the support plate 505. Once the pattern has been aligned to the semiconductor device 100, the energy source 507 generates the desired energy 511 (e.g., light) which passes through the patterned mask 509 and the optics 513 on its way to the photoresist 111. The patterned energy 515 impinging upon portions of the photoresist 111 induces a reaction of the PACs within the photoresist 111. The chemical reaction products of the PACs' absorption of the patterned energy 515 (e.g., acids/bases/free radicals) then reacts with the polymer resin, chemically altering the photoresist 111 in those portions that were illuminated through the patterned mask 509.

Alternatively, the patterning of the photoresist 111 may use multiple exposures. For example, in one embodiment the photoresist 111 may be exposed a first time using a first wavelength of energy, such as 254 nm. Then, after the first exposure, the photoresist 111 may be exposed a second time at a second wavelength, such as 193 nm. Any number of exposures with any combination of wavelengths may alternatively be utilized, and all such numbers and combinations are fully intended to be included within the scope of the embodiments.

Figure 6A:
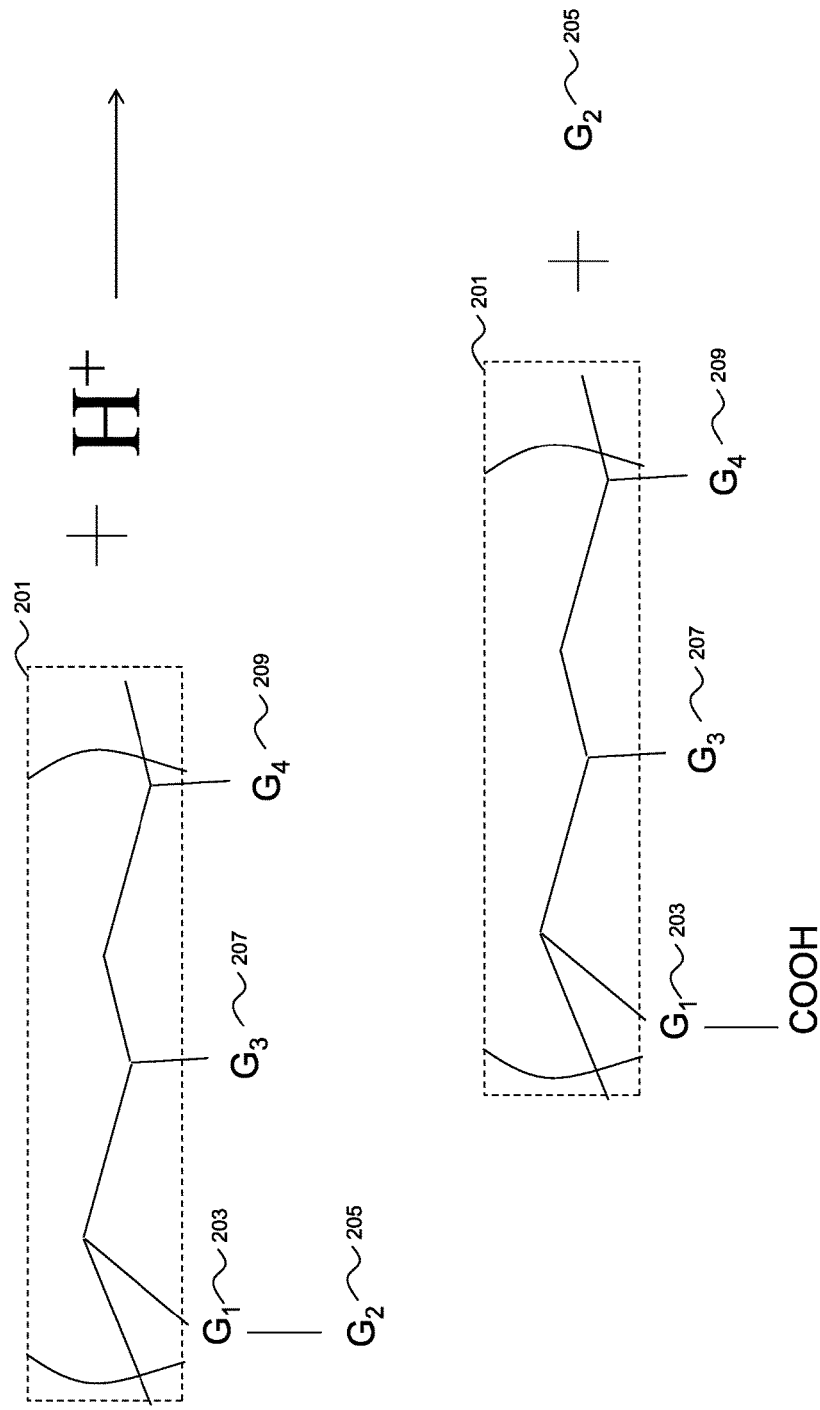
FIGS. 6A-6C illustrate mechanisms by which the photoresist resin will react with protons in accordance with some embodiments.

FIG. 6A illustrates a specific example in which the patterned energy 515 is a 193 nm wavelength of light, the PAC is a photoacid generator, and the photoresist resin comprises the group which will decompose 205 initially bonded to the high etching resistance moiety 203 (as described above with respect to FIG. 2). In this embodiment the patterned energy 515 will impinge upon the photoacid generator and the photoacid generator will absorb the impinging patterned energy 515. This absorption initiates the photoacid generator to generate a proton (e.g., a $H^+$ ion) within the photoresist 111. When the proton impacts the group which will decompose 205, the proton will react with the group which will decompose 205, cleaving the group which will decompose 205 from the high etching resistance moiety 203, and altering the properties of the polymer resin to cause the polymer resin to become more hydrophilic and lowering its solubility in organic solvents (such as a negative tone developer, discussed below with respect to FIG. 7).

The group which will decompose will then degas from the photoresist 111 either immediately during the exposure process or else during the post-exposure baking process (described below). However, the high etching resistance moiety 203 will not cleave from the polymer. As such, the high etching resistance moiety 203 will remain behind after the group which will decompose 205 has been cleaved, and the etching resistance of the photoresist 111 may be retained.

Figure 6B:
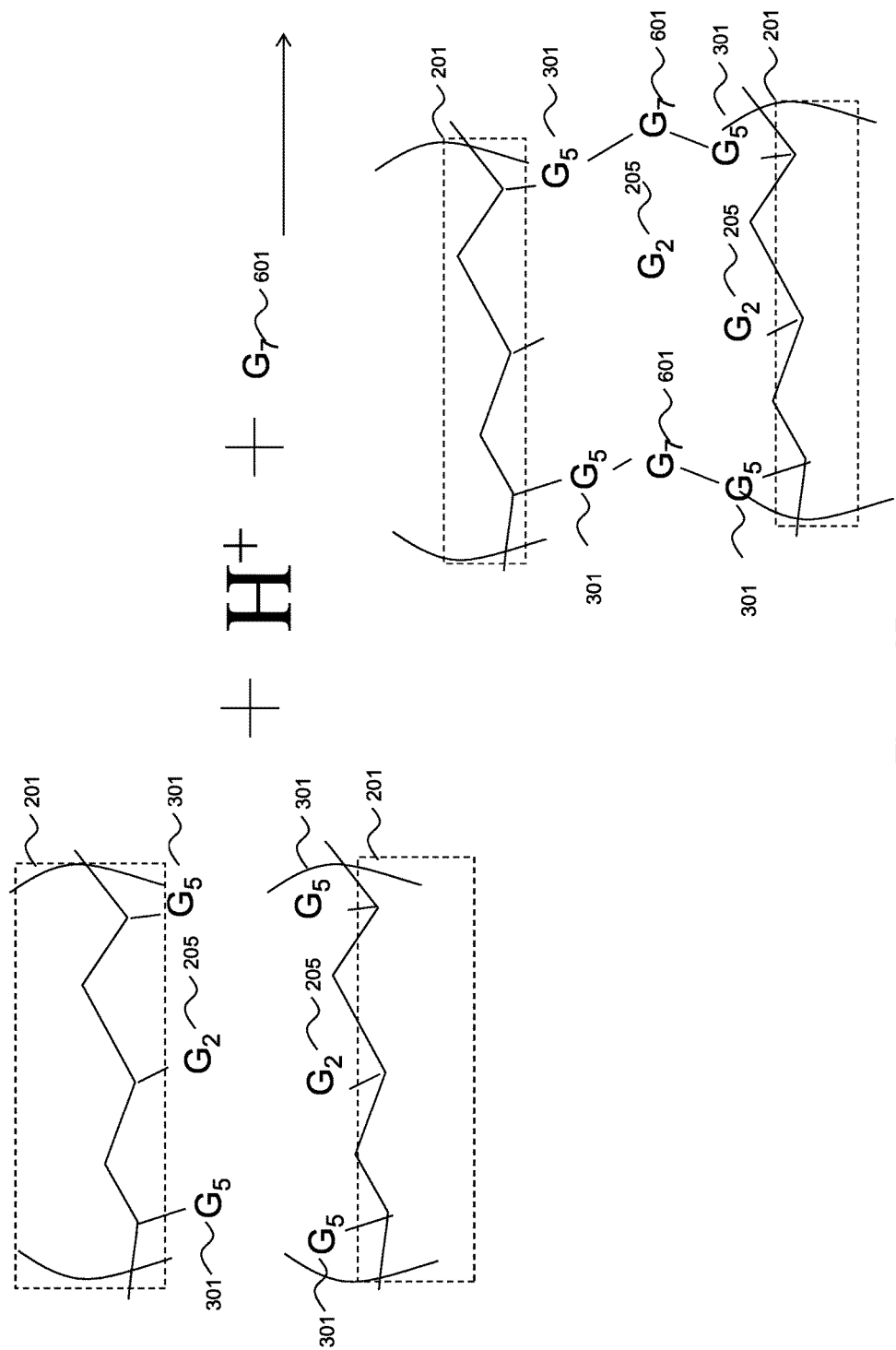

FIG. 6B illustrates an alternative embodiment in which the photoresist 111 comprises the polymer resin with the non-leaving group with the cross-linking site 301, the group which will decompose 205 (as described above with respect to FIG. 3), and the cross-linking agent (represented in FIG. 6B by the designation $G_7$ labeled 601). In this embodiment the patterned energy 515 from the exposure will impinge upon the PACs and generate the protons, which will then react with both the group which will decompose 205 (causing it to cleave) and also with the non-leaving group with the cross-linking site 301 and the cross-linking agent 601, causing the cross-linking agent 601 to bond with different ones of the polymers within the resin. Such a cross-linking will increase the density of the photoresist 111.

Additionally, because of the cross-linking that has occurred, the now-cleaved group which will decompose 205 will be trapped within the cross-linked polymers. As such, the group which will decompose 205 will be unable to degas and escape from the photoresist 111 as it otherwise would have. By preventing this degassing, the loss of the mass from the photoresist 111 may also be prevented, helping to reduce the amount of shrinkage that occurs during the process.

However, as one of ordinary skill in the art will recognize, the cross-linking described above is not the only cross-linking that will occur. Rather, may different sites within the polymer resins will actually cross-link as well. For example, one group which will decompose 205, instead of decomposing and leaving, may react with another group which will decompose 205, another non-leaving group with the cross-linking site 301, or an open carboxylic acid group (e.g., formed after another group which will decompose 205 has cleaved; see, e.g., FIG. 6A) on another polymer to cross-link the polymers. Additionally, any other suitable non-leaving group on the polymer backbone may react with, e.g., another non-leaving group or carboxylic acid group in order to cross-link the polymers.

Figure 6C:
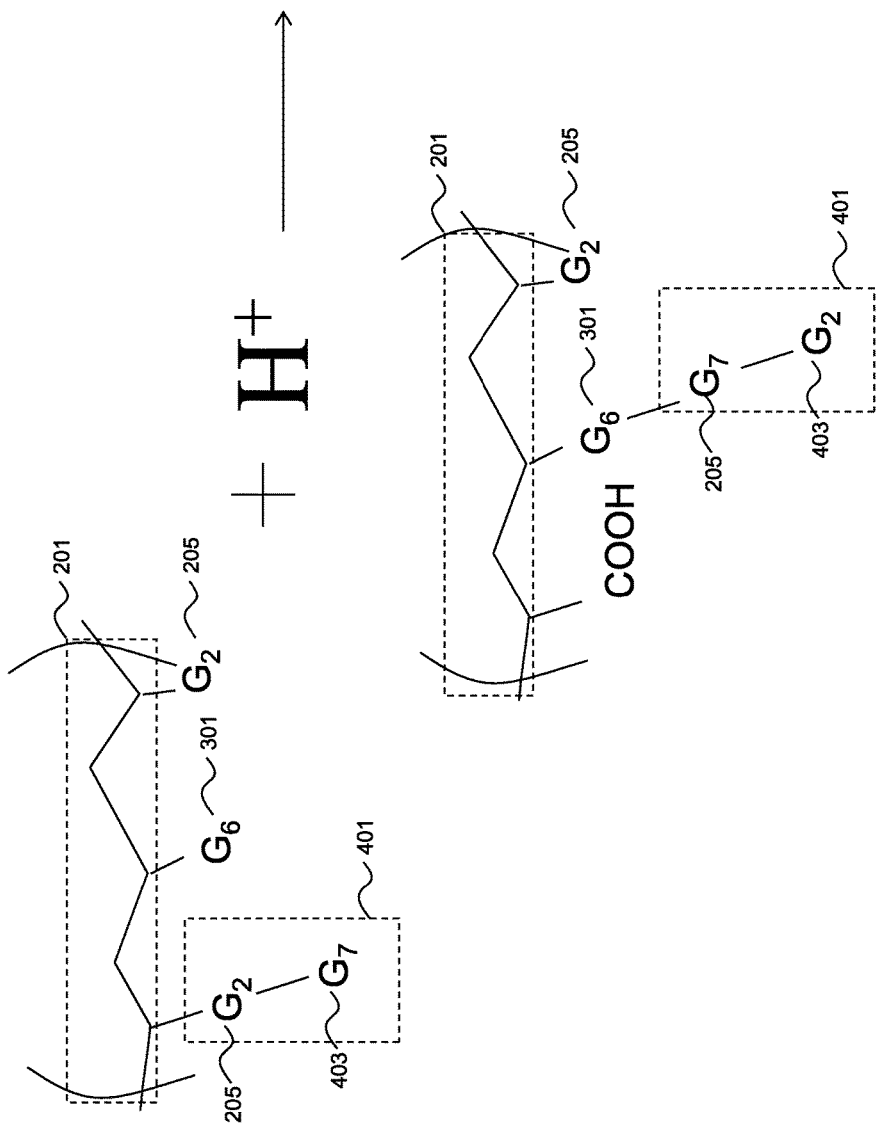

FIG. 6C illustrates yet another embodiment in which the photoresist 111 comprises the re-attaching group which will decompose 401 (as described above with respect to FIG. 4). In this embodiment the patterned energy 515 from the exposure will impinge upon the PACs and generate the protons, which will then react with the re-attaching group which will decompose 401, cleaving it from the hydrocarbon backbone 201. However, the protons will also react with the re-attachment group 403, which causes the re-attachment group 403 to act as a cross-linking agent and bond to one of the non-leaving group with the cross-linking site 301. By causing the group which will decompose to re-attach to the resin, the group which will decompose 205 will not degas and leave the photoresist 111. As such, there will be less loss of mass and an overall reduction in the loss of material from the photoresist 111, helping to reduce shrinkage of the photoresist 111.

Returning to FIG. 5, the exposure of the photoresist 111 may optionally occur using an immersion lithography technique. In such a technique an immersion medium (not individually illustrated in FIG. 5) may be placed between the imaging device 500 (and particularly between a final lens of the optics 513) and the photoresist 111. With this immersion medium in place, the photoresist 111 may be patterned with the patterned energy 515 passing through the immersion medium.

In this embodiment a protective layer (also not individually illustrated in FIG. 5) may be formed over the photoresist 111 in order to prevent the immersion medium from coming into direct contact with the photoresist 111 and leaching or otherwise adversely affecting the photoresist 111. In an embodiment the protective layer is insoluble within the immersion medium such that the immersion medium will not dissolve it and is immiscible in the photoresist 111 such that the protective layer will not adversely affect the photoresist 111. Additionally, the protective layer is transparent so that the patterned energy 515 may pass through the protective layer.

In an embodiment the protective layer comprises a protective layer resin within a protective layer solvent. The material used for the protective layer solvent is, at least in part, dependent upon the components chosen for the photoresist 111, as the protective layer solvent should not dissolve the materials of the photoresist 111 so as to avoid degradation of the photoresist 111 during application and use of the protective layer. In an embodiment the protective layer solvent includes alcohol solvents, fluorinated solvents, and hydrocarbon solvents.

Specific examples of materials that may be utilized for the protective layer solvent include methanol, ethanol, 1-propanol, isopropanol, n-propanol, 1-butanol, 2-butanol, 2-methyl-2-propanol, 3-methyl-1-butanol, isobutyl alcohol, tert-butyl alcohol, 1-pentanol, 2-pentanol, 3-pentanol, n-hexanol, cyclohecanol, 1-hexanol, 1-heptanol, 1-octanol, 2-hexanol, 2-heptanol, 2-octanol, 3-hexanol, 3-heptanol, 3-octanol, 4-octanol, 2-methyl-2-butanol, 3-methyl-1-butanol, 3-methyl-2-butanol, 2-methyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2,2,3,3,4,4-hexafluoro-1-butanol, 2,2,3,3,4,4,5,5-octafluoro-1-pentanol, 2,2,3,3,4,4,5,5,6,6-decafluoro-1-hexanol, 2,2,3,3,4,4- hexafluoro-1,5-pentanediol, 2,2,3,3,4,4,5,5-octafluoro-1,6-hexanediol, 2,2,3,3,4,4,5,5,6,6,7,7-dodecafluoro-1,8-diol, 2-fluoroanisole, 2,3-difluoroanisole, perfluorohexane, perfluoroheptane, perfluoro-2-pentanone, perfluoro-2-butyltetrahydrofuran, perfluorotetrahydrofuran, perfluorotributylamine, perfluorotetrapentylamine, toluene, xylene and anisole, and aliphatic hydrocarbon solvents, such as n-heptane, n-nonane, n-octane, n-decane, 2-methylheptane, 3-methylheptane, 3,3-dimethylhexane, 2,3,4-trimethylpentane, combinations of these, or the like.

The protective layer resin may comprise a protective layer repeating unit. In an embodiment the protective layer repeating unit may be an acrylic resin with a repeating hydrocarbon structure having a carboxyl group, an alicyclic structure, an alkyl group having one to five carbon atoms, a phenol group, or a fluorine atom-containing group. Specific examples of the alicyclic structure include a cyclohexyl group, an adamantyl group, a norbornyl group, an isobornyl group, a tricyclodecyl group, a tetracyclododecyl group, and the like. Specific examples of the alkyl group include an n-butyl group, an isobutyl group, or the like. However, any suitable protective layer resin may alternatively be utilized.

The protective layer composition may also include additional additives to assist in such things as adhesion, surface leveling, coating, and the like. For example, the protective layer composition may further comprise a protective layer surfactant, although other additives may also be added, and all such additions are fully intended to be included within the scope of the embodiment. In an embodiment the protective layer surfactant may be a alkyl cationic surfactant, an amide-type quaternary cationic surfactant, an ester-type quaternary cationic surfactant, an amine oxide surfactant, a betaine surfactant, an alkoxylate surfactant, a fatty acid ester surfactant, an amide surfactant, an alcohol surfactant, an ethylenediamine surfactant, or a fluorine- and/or silicon-containing surfactant.

Specific examples of materials that may be used for the protective layer surfactant include polyoxyethylene alkyl ethers, such as polyoxyethylene lauryl ether, polyoxyethylene stearyl ether, polyoxyethylene cetyl ether and polyoxyethylene oleyl ether; polyoxyethylene alkyl aryl ethers, such as polyoxyethylene octyl phenol ether and polyoxyethylene nonyl phenol ether; polyoxyethylene-polyooxypropylene block copolymers; sorbitan fatty acid esters, such as sorbitan monolaurate, sorbitan monopalmitate, sorbitan monostearate, sorbitan monooleate, sorbitan trioleate and sorbitan tristearate; and polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate.

Prior to application of the protective layer onto the photoresist 111, the protective layer resin and desired additives are first added to the protective layer solvent to form a protective layer composition. The protective layer solvent is then mixed to ensure that the protective layer composition has a consistent concentration throughout the protective layer composition.

Once the protective layer composition is ready for application, the protective layer composition may be applied over the photoresist 111. In an embodiment the application may be performed using a process such as a spin-on coating process, a dip coating method, an air-knife coating method, a curtain coating method, a wire-bar coating method, a gravure coating method, a lamination method, an extrusion coating method, combinations of these, or the like. In an embodiment the protective layer composition may be applied such that it has a thickness over the surface of the photoresist 111 of about 100 nm.

After the protective layer composition has been applied to the photoresist 111, a protective layer pre-bake may be performed in order to remove the protective layer solvent. In an embodiment the protective layer pre-bake may be performed at a temperature suitable to evaporate the protective layer solvent, such as between about 40° C. and 150° C., although the precise temperature depends upon the materials chosen for the protective layer composition. The protective layer pre-bake is performed for a time sufficient to cure and dry the protective layer composition, such as between about 10 seconds to about 5 minutes, such as about 90 seconds.

Once the protective layer has been placed over the photoresist 111, the semiconductor device 100 with the photoresist 111 and the protective layer are placed on the support plate 505, and the immersion medium may be placed between the protective layer and the optics 513. In an embodiment the immersion medium is a liquid having a refractive index greater than that of the surrounding atmosphere, such as having a refractive index greater than 1. Examples of the immersion medium may include water, oil, glycerine, glycerol, cycloalkanols, or the like, although any suitable medium may alternatively be utilized.

The placement of the immersion medium between the protective layer and the optics 513 may be done using, e.g., an air knife method, whereby fresh immersion medium is applied to a region between the protective layer and the optics 513 and controlled using pressurized gas directed towards the protective layer to form a barrier and keep the immersion medium from spreading. In this embodiment the immersion medium may be applied, used, and removed from the protective layer for recycling so that there is fresh immersion medium used for the actual imaging process.

However, the air knife method described above is not the only method by which the photoresist 111 may be exposed using an immersion method. Any other suitable method for imaging the photoresist 111 using an immersion medium, such as immersing the entire substrate 101 along with the photoresist 111 and the protective layer, using solid barriers instead of gaseous barriers, or using an immersion medium without a protective layer, may also be utilized. Any suitable method for exposing the photoresist 111 through the immersion medium may be used, and all such methods are fully intended to be included within the scope of the embodiments.

After the photoresist 111 has been exposed to the patterned energy 515, a post-exposure baking may be used in order to assist in the generating, dispersing, and reacting of the acid/base/free radical generated from the impingement of the patterned energy 515 upon the PACs during the exposure. Such assistance helps to create or enhance chemical reactions which generate chemical differences between the exposed region 501 and the unexposed region 503 within the photoresist 111. These chemical differences also cause differences in the solubility between the exposed region 501 and the unexposed region 503. In an embodiment this post-exposure baking may occur at temperatures of between about 50° C. and about 160° C. for a period of between about 40 seconds and about 120 seconds.

Additionally, the post exposure baking may be used, in addition to generating, dispersing, and reacting the acid/base/free radicals, to initiate or enhance the cross-linking of the polymers. In this embodiment the temperatures may be between about 70° C. and about 300° C., such as between about 80° C. and about 150° C. for a time period of between about 30 seconds and about 120 seconds.

Alternatively, instead of a single baking process as described above, the post exposure baking may be performed in a two-step baking process. In this embodiment the first step baking process may be performed at a temperature of between about 80° C. and about 120° C., such as about 110° C., for a time period of between about 30 seconds and about 120 seconds, such as about 60 seconds. After the first step has been completed, a second making process may be performed at a temperature of between about 80° C. and about 120° C., such as about 90° C., for a time period of between about 30 seconds and about 120 seconds, such as about 60 seconds.

Figure 7:
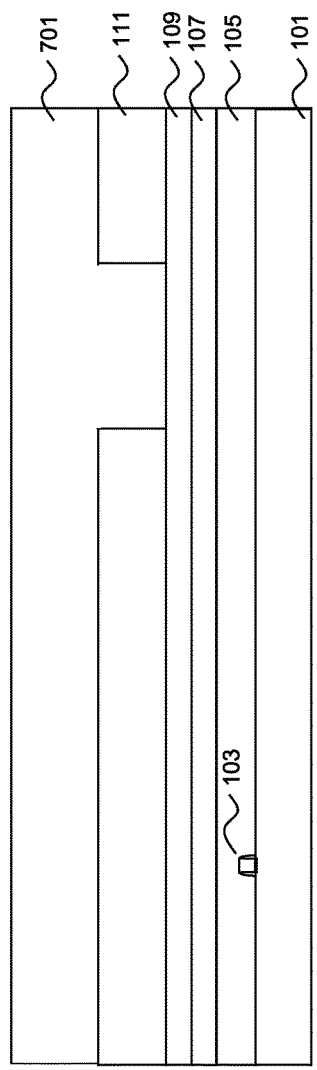
FIG. 7 illustrates a development of the photoresist in accordance with some embodiments.

FIG. 7 illustrates a development of the photoresist 111 with the use of a developer 701 after the photoresist 111 has been exposed. After the photoresist 111 has been exposed and the post-exposure baking has occurred, the photoresist 111 may be developed using either a negative tone developer or a positive tone developer, depending upon the desired pattern for the photoresist 111. In an embodiment in which the unexposed region 503 of the photoresist 111 is desired to be removed to form a negative tone, a negative tone developer such as an organic solvent or critical fluid may be utilized to remove those portions of the photoresist 111 which were not exposed to the patterned energy 515 and, as such, retain their original solubility. Specific examples of materials that may be utilized include hydrocarbon solvents, alcohol solvents, ether solvents, ester solvents, critical fluids, combinations of these, or the like. Specific examples of materials that can be used for the negative tone solvent include hexane, heptane, 2-heptanone, n-butyl acetate, octane, toluene, xylene, dichloromethane, chloroform, carbon tetrachloride, trichloroethylene, methanol, ethanol, propanol, butanol, critical carbon dioxide, diethyl ether, dipropyl ether, dibutyl ether, ethyl vinyl ether, dioxane, propylene oxide, tetrahydrofuran, cellosolve, methyl cellosolve, butyl cellosolve, methyl carbitol, diethylene glycol monoethyl ether, acetone, methyl ethyl ketone, methyl isobutyl ketone, isophorone, cyclohexanone, methyl acetate, ethyl acetate, propyl acetate, butyl acetate, pyridine, formamide, N,N-dimethyl formamide, or the like.

If a positive tone development is desired, a positive tone developer such as a basic aqueous solution may be utilized to remove those portions of the photoresist 111 which were exposed to the patterned energy 515 and which have had their solubility modified and changed through the chemical reactions. Such basic aqueous solutions may include tetra methyl ammonium hydroxide (TMAH), tetra butyl ammonium hydroxide, sodium hydroxide, potassium hydroxide, sodium carbonate, sodium bicarbonate, sodium silicate, sodium metasilicate, aqueous ammonia, monomethylamine, dimethylamine, trimethylamine, monoethylamine, diethylamine, triethylamine, monoisopropylamine, diisopropylamine, triisopropylamine, monobutylamine, dibutylamine, monoethanolamine, diethanolamine, triethanolamine, dimethylaminoethanol, diethylaminoethanol, potassium metasilicate, sodium carbonate, tetraethylammonium hydroxide, combinations of these, or the like.

However, as one of ordinary skill in the art will recognize, the above description of positive tone developers and negative tone developers are only intended to be illustrative and are not intended to limit the embodiments to only the developers listed above. Rather, any suitable type of developer, including acid developers or even water developers, that may be utilized to selectively remove a portion of the photoresist 111 that has a different property (e.g., solubility) than another portion of the photoresist 111, may alternatively be utilized, and all such developers are fully intended to be included within the scope of the embodiments.

In an embodiment in which immersion lithography is utilized to expose the photoresist 111 and a protective layer is utilized to protect the photoresist 111 from the immersion medium, the developer 701 may be chosen to remove not only those portions of the photoresist 111 that are desired to be removed, but may also be chosen to remove the protective layer in the same development step. Alternatively, the protective layer may be removed in a separate process, such as by a separate solvent from the developer 701 or even an etching process to remove the protective layer from the photoresist 111 prior to development.

FIG. 7 illustrates an application of the developer 701 to the photoresist 111 using, e.g., a spin-on process. In this process the developer 701 is applied to the photoresist 111 from above the photoresist 111 while the semiconductor device 100 (and the photoresist 111) is rotated. In an embodiment the developer 701 may be supplied at a flow rate of between about 10 ml/min and about 2000 ml/min, such as about 1000 ml/min, while the semiconductor device 100 is being rotated at a speed of between about 100 rpm and about 3500 rpm, such as about 1500 rpm. In an embodiment the developer 701 may be at a temperature of between about 10° C. and about 80° C., such as about 50° C., and the development may continue for between about 1 minute to about 60 minutes, such as about 30 minutes.

However, while the spin-on method described herein is one suitable method for developing the photoresist 111 after exposure, it is intended to be illustrative and is not intended to limit the embodiments. Rather, any suitable method for development, including dip processes, puddle processes, spray-on processes, combinations of these, or the like, may alternatively be used. All such development processes are fully intended to be included within the scope of the embodiments.

FIG. 7 illustrates a cross-section of the development process in which a negative tone developer is utilized. As illustrated, the developer 701 is applied to the photoresist 111 and dissolves the unexposed portion 603 of the photoresist 111. This dissolving and removing of the unexposed portion 603 of the photoresist 111 leaves behind an opening within the photoresist 111 that patterns the photoresist 111 in the shape of the patterned energy 515, thereby transferring the pattern of the patterned mask 509 to the photoresist 111.

However, by utilizing the embodiments described herein, the amount of mass loss and shrinkage can be reduced. For example, by using the embodiments described herein, the total film loss can be reduced by about 20%, while the post exposure baking shrinkage can be reduced by about 10%. As such, the contrast can be improved, with the dissolution contrast being reduced for a negative tone development while improving the etching resistance for a negative tone development such that it is similar to a positive tone development. Additionally, the mechanical properties of the photoresist 111, such as its molecular weight, its transition temperature (Tg), its resistance to solvents, may be improved.

Figure 8:
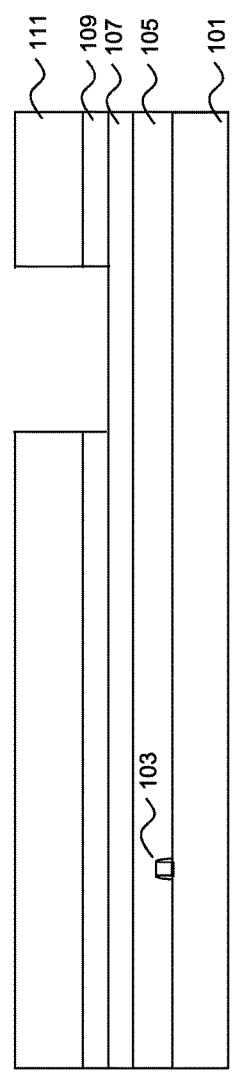
FIG. 8 illustrates a removal of a developer in accordance with some embodiments.

FIG. 8 illustrates a removal of the developer 701 and the photoresist 111 after it has been developed with the developer 701. In an embodiment the developer 701 may be removed using, e.g., a spin-dry process, although any suitable removal technique may alternatively be utilized. After the photoresist 111 has been developed additional processing may be performed on the layer to be patterned 109 while the photoresist 111 is in place. As one example, a reactive ion etch or other etching process may be utilized to transfer the pattern of the photoresist 111 to the underlying layer to be patterned 109. Alternatively, in an embodiment in which the layer to be patterned 109 is a seed layer, the layer to be patterned 109 may be plated in order to form, e.g., a copper pillar, or other conductive structure in the opening of the photoresist 111. Any suitable processing, whether additive or subtractive, that may be performed while the photoresist 111 is in place may be performed, and all such additional processing are fully intended to be included within the scope of the embodiments.

Once the layer to be patterned 109 has been patterned using the photoresist 111, the photoresist may be removed from the layer to be patterned 109 (not separately illustrated in FIG. 8). In an embodiment an ashing process may be utilized in order to remove the photoresist 111, whereby the temperature of the photoresist 111 is increased to cause a thermal breakdown of the photoresist 111, which can then be removed using a cleaning procedure such as a rinse. Alternatively the photoresists 111 may be removed using, e.g., a wet etching process. Any suitable method for removing the photoresist 111 may be used, and all such methods are fully intended to be included within the scope of the embodiment.

Figure 9:
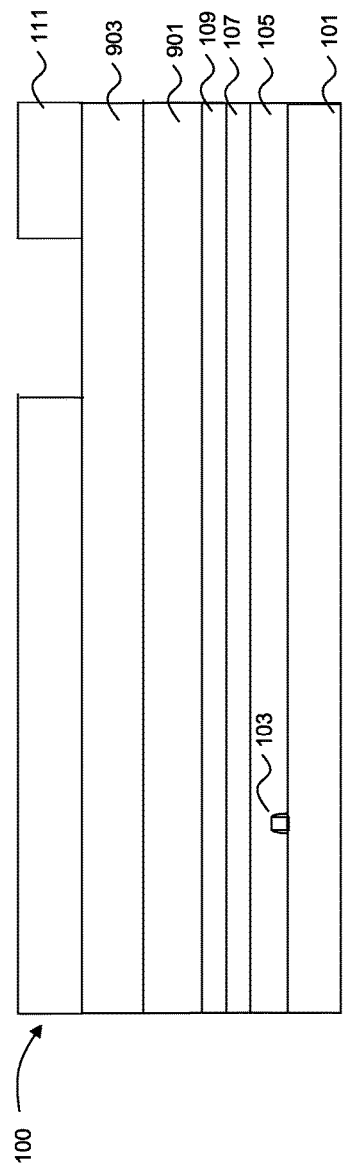
FIG. 9 illustrates another embodiment in which a bottom antireflective layer and a middle layer are utilized along with the photoresist.

FIG. 9 illustrates another embodiment in which the photoresist 111 is utilized along with a bottom anti-reflective coating (BARC) layer 901 and a middle layer 903. The BARC layer 901, as its name suggests, has a different optical property than the photoresist 111 that works to prevent the uncontrolled and undesired reflection of energy (e.g., light) such as light back into the overlying photoresist 111 during an exposure of the photoresist 111, thereby preventing the reflecting light from causing reactions in an undesired region of the photoresist 111. For example, the BARC layer 901 may have a different refractive index (n), a different extinction coefficient (k), or thickness (T) value than the photoresist 111. Additionally, the BARC layer 901 may be used to provide a planar surface, helping to reduce the negative effects of the energy impinging at an angle.

In this embodiment the BARC layer 901 may have a thickness T of between about 1000 Å and about 2600 Å, the middle layer 903 may have a thickness T of between about 200 Å to about 500 Å, and the photoresist 111 may have a thickness of between about 500 Å and about 1500 Å. However, these thicknesses are intended to be illustrative and are not intended to be limiting upon the embodiments. Rather, any suitable thickness may alternatively be utilized for the BARC layer 901, the middle layer 903, and the photoresist 111, and all such thicknesses are fully intended to be included within the scope of the embodiments.

In an embodiment the BARC layer 901 comprises a polymer resin, a catalyst, and a cross-linking agent, all of which are placed into a BARC solvent for dispersal. The polymer resin may comprise a polymer with various monomers bonded together. In an embodiment the polymer may comprise different monomers such as a cross-linking monomer and a monomer with chromophore units. In an embodiment, the monomer with the chromophore unit may comprise vinyl compounds containing substituted and unsubstituted phenyl, substituted and unsubstituted anthracyl, substituted and unsubstituted phenanthryl, substituted and unsubstituted naphthyl, substituted and unsubstituted acridine, substituted and unsubstituted quinolinyl and ring-substituted quinolinyls (e.g., hydroxyquinolinyl), substituted and unsubstituted heterocyclic rings containing heteroatoms such as oxygen, nitrogen, sulfur, or combinations thereof, such as pyrrolidinyl, pyranyl, piperidinyl, acridinyl, quinolinyl. The substituents in these units may be any hydrocarbyl group and may further contain heteroatoms, such as, oxygen, nitrogen, sulfur or combinations thereof, such as alkylenes, esters, ethers, combinations of these, or the like, with carbon atoms between 1 and 12.

In specific embodiments the monomers with chromophore units include styrene, hydroxystyrene, acetoxystyrene, vinyl benzoate, vinyl 4-tert-butylbenzoate, ethylene glycol phenyl ether acrylate, phenoxypropyl acrylate, N-methyl maleimide, 2-(4-benzoyl-3-hydroxyphenoxy) ethyl acrylate, 2-hydroxy-3-phenoxypropyl acrylate, phenyl methacrylate, benzyl methacrylate, 9-anthracenylmethyl methacrylate, 9-vinylanthracene, 2-vinylnaphthalene, N-vinylphthalimide, N-(3-hydroxy)phenyl methacrylamide, N-(3-hydroxy-4-hydroxycarbonylphenylazo)phenyl methacrylamide, N-(3-hydroxyl-4-ethoxycarbonylphenylazo) phenyl methacrylamide, N-(2,4-dinitrophenylamino phenyl) maleimide, 3-(4-acetoaminophenyl)azo-4-hydroxystyrene, 3-(4-ethoxycarbonylphenyl)azo-acetoacetoxy ethyl methacrylate, 3-(4-hydroxyphenyl)azo-acetoacetoxy ethyl methacrylate, tetrahydroammonium sulfate salt of 3-(4-sulfophenyl)azoacetoacetoxy ethyl methacrylate combinations of these, or the like. However, any suitable monomer with chromophore units to absorb the impinging light and prevent the light from being reflected may alternatively be used, and all such monomers are fully intended to be included within the scope of the embodiments.

The cross-linking monomer may be used to cross-link the monomer with other polymers within the polymer resin to modify the solubility of the BARC layer 901, and may optionally have an acid labile group. In a particular embodiment the cross-linking monomer may comprise a hydrocarbon chain that also comprises, e.g., a hydroxyl group, a carboxyl acid group, a carboxylic ester group, epoxy groups, urethane groups, amide groups, combinations of these, and the like. Specific examples of cross-linking monomers that may be utilized include polyhydroxystyrene, poly(hydroxynaphthalene), poly(meth)acrylates, polyarylates, polyesters, polyurethanes, alkyd resins (aliphatic polyesters), poly(hydroxystyrene-methylmethacrylate), homopolymers and/or copolymers obtained by polymerization of at least one of the following monomers: styrene, hydroxystyrene, hydroxyethyl(meth)acrylate, hydroxypropyl(meth)acrylate, methyl(meth)acrylate, ethyl(meth)acrylate, (meth)acrylic acid, poly(hydroxystyrene-styrene-methacrylate), poly(4-hydroxystyrene), and poly(pyromellitic dianhydride-ethylene glycol-propylene oxide).

The various monomers will be polymerized with one another to form a polymer structure with a carbon chain backbone for the polymer resin. In an embodiment the polymer structure may have a carbon chain backbone that is an acrylic, a polyester, an epoxy novalac, a polysaccharide, a polyether, a polyimide, a polyurethane, and mixtures thereof.

Additionally, as one of ordinary skill in the art will recognize, the above description for the various monomers that may be polymerized to form the polymer resin for the BARC layer 901 are intended to be illustrative and are not intended to limit the embodiments in any fashion. Rather, any suitable monomer or combination of monomers that perform the desired functions of the monomers described herein may also be utilized. All such monomers are fully intended to be included within the scope of the embodiments.

The catalyst may be a compound that is used to initiate a cross-linking reaction between the polymers within the polymer resin, and may be, e.g., a thermal acid generator, a photoacid generator, a photobase generator, suitable combinations of these, or the like. In an embodiment in which the catalyst is a thermal acid generator, the catalyst will generate an acid when sufficient heat is applied to the BARC layer 901. Specific examples of the thermal acid generator include butane sulfonic acid, triflic acid, nonaflurobutane sulfonic acid, nitrobenzyl tosylates, such as 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; alkyl ammonium salts of organic acids, such as triethylammonium salt of 10-camphorsulfonic acid, combinations of these, or the like.

In an embodiment in which the catalyst is a photoacid generator, the catalyst may comprise halogenated triazines, onium salts, diazonium salts, aromatic diazonium salts, phosphonium salts, sulfonium salts, iodonium salts, imide sulfonate, oxime sulfonate, disulfone, o-nitrobenzylsulfonate, sulfonated esters, halogenerated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, suitable combinations of these, and the like.

Specific examples of photoacid generators that may be used include α-(trifluoromethylsulfonyloxy)-bicyclo[2.2.1] hept-5-ene-2,3-dicarbo-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl) sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl) triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitrosubstituted benzyl alcohols, naphthoquinone-4-diazides, alkyl disulfones, and the like.

In other embodiment the catalyst may be a photobase generator. In such an embodiment the photobase generator may comprise quaternary ammonium dithiocarbamates, a aminoketones, oxime-urethane containing molecules such as dibenzophenoneoxime hexamethylene diurethan, ammonium tetraorganylborate salts, and N-(2-nitrobenzyloxycarbonyl) cyclic amines, suitable combinations of these, or the like.

The cross-linking agent may also be added to the BARC layer 901. The cross-linking agent reacts with the polymers within the BARC layer 901 after exposure, assisting in increasing the cross-linking density of the photoresist, which helps to improve the resist pattern and resistance to dry etching. In an embodiment the cross-linking agent may be an melamine based agent, a urea based agent, ethylene urea based agent, propylene urea based agent, glycoluril based agent, an aliphatic cyclic hydrocarbon having a hydroxyl group, a hydroxyalkyl group, or a combination of these, oxygen containing derivatives of the aliphatic cyclic hydrocarbon, glycoluril compounds, etherified amino resins, a polyether polyol, a polyglycidy ether, a vinyl ether, a triazene, combinations of these, or the like.

Specific examples of materials that may be utilized as a cross-linking agent include melamine, acetoguanamine, benzoguanamine, urea, ethylene urea, or glycoluril with formaldehyde, glycoluril with a combination of formaldehyde and a lower alcohol, hexamethoxymethylmelamine, bismethoxymethylurea, bismethoxymethylbismethoxyethylene urea, tetramethoxymethylglycoluril, and tetrabutoxymethylglycoluril, mono-, di-, tri-, or tetra-hydroxymethylated glycoluril, mono-, di-, tri-, and/or tetra-methoxymethylated glycoluril, mono-, di-, tri-, and/or tetra-ethoxymethylated glycoluril, mono-, di-, tri-, and/or tetra-propoxymethylated glycoluril, and mono-, di-, tri-, and/or tetra-butoxymethylated glycoluril, 2,3-dihydroxy-5-hydroxymethylnorbornane, 2-hydroy-5,6-bis(hydroxymethyl) norbornane, cyclohexanedimethanol, 3,4,8(or 9)-trihydroxytricyclodecane, 2-methyl-2-adamantanol, 1,4-dioxane-2,3-diol and 1,3,5-trihydroxycyclohexane, tetramethoxymethyl glycoluril, methylpropyltetramethoxymethyl glycoluril, and methylphenyltetramethoxymethylglycoluril, 2,6-bis(hydroxymethyl)p-cresol, N-methoxymethyl- or N-butoxymethyl-melamine. Additionally, compounds obtained by reacting formaldehyde, or formaldehyde and lower alcohols with amino group-containing compounds, such as melamine, acetoguanamine, benzoguanamine, urea, ethylene urea and glycoluril, and substituting the hydrogen atoms of the amino group with hydroxymethyl group or lower alkoxymethyl group, examples being hexamethoxymethylmelamine, bismethoxymethyl urea, bismethoxymethylbismethoxyethylene urea, tetramethoxymethyl glycoluril and tetrabutoxymethyl glycoluril, copolymers of 3-chloro-2-hydroxypropyl methacrylate and methacrylic acid, copolymers of 3-chloro-2-hydroxypropyl methacrylate and cyclohexyl methacrylate and methacrylic acid, copolymers of 3-chloro-2-hydroxypropyl methacrylate and benzyl methacrylate and methacrylic acid, bisphenol A-di(3-chloro-2-hydroxypropyl) ether, poly(3-chloro-2-hydroxypro-pyl)ether of a phenol novolak resin, pentaerythritol tetra(3-chloro-2-hydroxypropyl)ether, trimethylolmethane tri(3-chloro-2-hydroxypropyl)ether phenol, bisphenol A-di(3-acetoxy-2-hydroxypropyl)ether, poly(3-acetoxy-2-hydroxypropyl)ether of a phenol novolak resin, pentaerythritol tetra(3-acetoxy-2-hydroxypropyl)ether, pentaerythritol poly(3-chloroacetoxy-2-hydroxypropyl)ether, trimethylolmethane tri(3-acetoxy-2-hydroxypropyl)ether, combinations of these, or the like.

The individual components of the BARC layer 901 may be placed into the BARC solvent in order to aid in the mixing and placement of the BARC layer 901. To aid in the mixing and placement of the BARC layer 901, the solvent is chosen at least in part based upon the materials and monomers chosen for the polymer resin of the BARC layer 901 as well as the catalyst. In particular, the BARC solvent is chosen such that the polymer resin, the catalysts, and the cross-linking agent can be evenly dissolved into the BARC solvent and dispensed upon the substrate 101.

In an embodiment the BARC solvent may be an organic solvent, and may comprise any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, ethylene glycol alkyl ether acetates, diethylene glycols, propylene glycol alkyl ether acetates, alkylene glycol alkyl ether esters, alkylene glycol monoalkyl esters, or the like.

Specific examples of materials that may be used as the BARC solvent include, acetone, methanol, ethanol, toluene, xylene, 4-hydroxy-4-methyl-2-pentatone, tetrahydrofuran, methyl ethyl ketone, cyclohexanone, methyl isoamyl ketone, 2-heptanone, ethylene glycol, ethylene glycol monoacetate, ethylene glycol dimethyl ether, ethylene glycol methylethyl ether, ethylene glycol monoethyl ether, methyl cellosolve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, diethylene glycol monoethyl ether, diethylene glycol monobutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, ethyl acetate, butyl acetate, methyl lactate and ethyl lactate, propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monobutyl ether acetate, propylene glycol monomethyl ether propionate, propylene glycol monoethyl ether propionate, propylene glycol methyl ether adcetate, proplylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, propyl lactate, and butyl lactate, ethyl 3-ethoxypropionate, methyl 3-methoxypropionate, methyl 3-ethoxypropionate, and ethyl 3-methoxypropionate, β-propiolactone, β-butyrolactone, γ-butyrolactone, α-methyl-γ-butyrolactone, β-methyl-γ-butyrolactone, γ-valerolactone, γ-caprolactone, γ-octanoic lactone, α-hydroxy-γ-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, pylene carbonate, vinylene carbonate, ethylene carbonate, and butylene carbonate, acetate-2-methoxyethyl, acetate-2-ethoxyethyl, acetate-2-(2-ethoxyethoxy)ethyl, acetate-3-methoxy-3-methylbutyl, acetate-1-methoxy-2-propyl, dipropylene glycol, monomethylether, monoethylether, monopropylether, monobutylehter, monophenylether, dipropylene glycol monoacetate, dioxane, etheyl lactate, methyl acetate, ethyl acetate, butyl acetate, methyl puruvate, ethyl puruvate, propyl pyruvate, methyl methoxypropionate, ethyl ethoxypropionate, n-methylpyrrolidone (NMP), 2-methoxyethyl ether (diglyme), ethylene glycol monom-ethyl ether, propylene glycol monomethyl ether; methyl proponiate, ethyl proponiate and ethyl ethoxy proponiate, methylethyl ketone, cyclohexanone, 2-heptanone, carbon dioxide, cyclopentatone, cyclohexanone, ethyl 3-ethocypropionate, propylene glycol methyl ether acetate (PGMEA), methylene cellosolve, butyle acetate, and 2-ethoxyethanol, N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, or the like.

However, as one of ordinary skill in the art will recognize, the materials listed and described above as examples of materials that may be utilized for the solvent component of the BARC layer 901 are merely illustrative and are not intended to limit the embodiments. Rather, any suitable material that may dissolve the polymer resin, the catalyst, and the cross-linking layer may alternatively be utilized to help mix and apply the BARC layer 901. All such materials are fully intended to be included within the scope of the embodiments.

Additionally, other components may also be added into the material for the BARC layer 901 if desired. For example, in an embodiment monomeric dyes, surface leveling agents, adhesion promoters, anti-foaming agent, and the like, may alternatively be utilized. Any suitable additive may be added into the material for the BARC layer 901, and all such additives are fully intended to be included within the scope of the embodiments.

In an embodiment the polymer resin, the catalysts, and the cross-linking agent, along with any desired additives or other agents, are added to the BARC solvent to form the material for the BARC layer 901. Once added, the mixture is then mixed in order to achieve an even and constant composition throughout the material for the BARC layer 901 in order to ensure that there are no defects caused by an uneven mixing or non-constant composition of the material for the BARC layer 901. Once mixed together, the material for the BARC layer 901 may either be stored prior to its usage or else used immediately.

In its original mixed form, the material for the BARC layer 901 may comprise a constant composition of components, with the polymer resin having a concentration of between about 0.1% and about 60%, the catalyst having a concentration of between about 0.01% and about 10%, and the cross-linking agent having a concentration of between about 0.01% and about 30%. However, while these concentrations are illustrative, any suitable combinations of the various components of the material for the BARC layer 901 may be used, and all such combinations are fully intended to be included within the scope of the embodiments.

Once the material for the BARC layer 901 has been prepared, the material for the BARC layer 901 may be utilized by initially applying the material for the BARC layer 901 onto the substrate 101. The material for the BARC layer 901 may be applied to the substrate 101 so that the material for the BARC layer 901 coats an upper exposed surface of the substrate 101, and may be applied using a process such as a spin-on coating process, a dip coating method, an air-knife coating method, a curtain coating method, a wire-bar coating method, a gravure coating method, a lamination method, an extrusion coating method, combinations of these, or the like. In an embodiment the material for the BARC layer 901 may be initially applied such that it has a constant concentration and has a thickness over a top of the substrate 101 of between about 10 nm and about 1000 nm, such as about 100 nm.

Once the material for the BARC layer 901 is in place, a pre-bake of the BARC layer 901 may be performed. In an embodiment once the BARC layer 901 has been applied to the substrate 101, the pre-bake of the BARC layer 901 is performed in order to cure and dry the BARC layer 901 prior to an application of the middle layer 903 and the photoresist 111. The curing and drying of the BARC layer 901 removes a portion of the BARC solvent components but leaves behind the polymer resin, the catalysts, the cross-linking agent, and other additives. In an embodiment the pre-bake may be performed at a temperature suitable to evaporate the BARC solvent, such as between about 40° C. and 150° C., although the precise temperature depends upon the materials chosen for the BARC layer 901. The pre-bake is performed for a time sufficient to cure and dry the BARC layer 901, such as between about 10 seconds to about 5 minutes, such as about 90 seconds.

However, as one of ordinary skill in the art will recognize, the above description of the BARC layer 901 is only intended to be illustrative and is not intended to limit the embodiments. Rather, any suitable material, such as hexamethyldisilazane (HMDS) may alternatively be utilized. All such materials are fully intended to be included within the scope of the embodiments.

The middle layer 903 may be placed over the BARC layer 901. In an embodiment the middle layer 903 may be an organic layer or inorganic layer that has a different etch resistance than the photoresist 111. In an embodiment the middle layer 903 comprises at least one etching resistance molecule such as a low onishi number structure, a double bond structure, a triple bond structure, titanium, titanium nitride, aluminum, aluminum oxide, silicon oxynitride, or the like.

In a particular embodiment the middle layer 903 is a hard mask material such as silicon, silicon nitride, oxides, oxynitrides, silicon carbide, combinations of these, or the like. The hard mask material for the middle layer 903 may be formed through a process such as chemical vapor deposition (CVD), although other processes, such as plasma enhanced chemical vapor deposition (PECVD), low pressure chemical vapor deposition (LPCVD), spin-on coating, or even silicon oxide formation followed by nitridation, may alternatively be utilized. Any suitable method or combination of methods to form or otherwise place the hard mask material may be utilized, and all such methods or combinations are fully intended to be included within the scope of the embodiments. The middle layer 903 may be formed to a thickness of between about 100 Å and about 800 Å, such as about 300 Å.

Once a layer of the hard mask material for the middle layer 903 has been formed, the photoresist 111 may be placed and patterned over the hard mask material for the middle layer 903. The placement of the photoresist 111 over the hard mask material for the middle layer 903 and the patterning of the photoresist 111 may be similar to the placement of the photoresist 111 and the development of the photoresist as described above with respect to FIGS. 1-7. For example, the photoresist 111 may be placed using a spin-on process, illuminated using the photoresist imaging device 500, and then developed using the developer 701.

Figure 10:
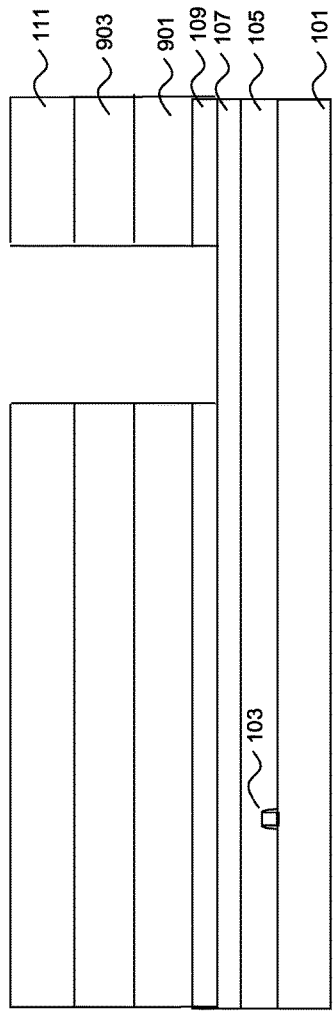
FIG. 10 illustrates a patterning of the layer to be patterned using the bottom antireflective layer, the middle layer, and the photoresist.

FIG. 10 illustrates that, once the photoresist 111 has been patterned into the desired pattern, the photoresist 111 may be used as a mask to pattern the hard mask material of the middle layer 903. For example, the pattern of the photoresist 111 may be transferred to the middle layer 903 using a anisotropic etching process such as reactive ion etching (RIE), whereby ions of a suitable etchant such as $CF_4/O_2$, may be utilized in a dry etch to remove portions of the middle layer 903 exposed by the patterned photoresist 111. However, any other suitable etchant, such as $CHF_3/O_2$, $CH_2F_2$, $CH_3F$, or the like, and any other suitable method of removal, such as a wet stripping, may alternatively be used.

FIG. 10 further illustrates that once the pattern of the photoresist 111 has been transferred to the middle layer 903, the middle layer 903 may be used to transfer the pattern of the photoresist 111 to the BARC layer 901. In an embodiment the BARC layer 901 may be removed using an etching process that utilizes the photoresist 111 and the middle layer 903 (now patterned) as a masking layer. The etching process may be a dry etch process utilizing an etchant such as oxygen, nitrogen, hydrogen, ammonia, sulfur hexafluoride, difluoromethane, nitrogen trifluoride, chlorine trifluoride, chlorine, carbon monoxide, carbon dioxide, helium, boron dichloride, argon, fluorine, trifluoromethane, tetrafluoromethane, perfluorocyclobutane, perfluoropropane, combinations of these, or the like. However, any other suitable etch process, such as a wet etch, or even a wet etch performed simultaneously as the middle layer 903, and any other suitable etchants may alternatively be used.

By utilizing the BARC layer 901 as an underlayer and as an anti-reflective coating, a more uniform layer may be formed over a variety of different underlying terrains. By creating a more uniform layer, subsequent processing may be better controlled, leading to a more efficient manufacturing process capable of making devices with smaller and smaller dimensions.

By utilizing the additional structures on the hydrocarbon backbone as discussed in the above described embodiments, each embodiment can independently decrease shrinkage of the photoresist 111 below 20% after the post-exposure baking. Such a reduction in the shrinkage reduces the deterioration of the critical dimensions of the photoresist 111 and allows for smaller and smaller images to be formed within the photoresist 111.

In accordance with an embodiment, a photoresist comprising a hydrocarbon backbone is provided. A high etch resistance structure is attached to the hydrocarbon backbone, and a group which will decompose bonded to the high etch resistance structure.

In accordance with another embodiment, a photoresist comprising a group which will decompose bonded to a hydrocarbon backbone is provided. A re-attachment group is bonded to the group which will decompose.

In accordance with yet another embodiment, a method of manufacturing a semiconductor device comprising dispensing a photoresist onto a substrate, wherein the photoresist comprises a high etch resistance structure attached to a hydrocarbon backbone is provided. A group which will decompose is bonded to the high etch resistance structure. The photoresist is exposed to a patterned energy source, and the photoresist is developed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   dispensing a photoresist onto a substrate, the photoresist comprising a polymer comprising:
   a hydrocarbon backbone; and
   a group which will decompose bonded to the hydrocarbon backbone; and
   exposing the photoresist to a patterned energy source, wherein the exposing the photoresist initiates a first set of reactions, the first set of reactions comprising:
   a decomposition of the group which will decompose from a first point on the hydrocarbon backbone; and
   a bonding of the group which will decompose to a second point on the hydrocarbon backbone different from the first point on the hydrocarbon backbone.

2. The method of claim 1, wherein the group which will decompose comprises a reattachment group, the reattachment group comprising $OCH_3$.

3. The method of claim 1, wherein the group which will decompose comprises a reattachment group, the reattachment group comprising $OC_2H_5$.

4. The method of claim 1, wherein the group which will decompose comprises a reattachment group, the reattachment group comprising $OC_3H_7$.

5. The method of claim 1, wherein the group which will decompose comprises a reattachment group, the reattachment group comprising $CH_2OC_3H_7$.

6. The method of claim 1, wherein the group which will decompose comprises a reattachment group, the reattachment group comprising $CH_2CH_2OC_4H_9$.

7. A photoresist comprising:
   a polymer comprising:
   a hydrocarbon backbone; and
   a high etch resistance structure attached to a hydrocarbon backbone, wherein the high etch resistance structure comprises a bridged cyclic structure with at least two rings bonded to a carbon in the hydrocarbon backbone through only carbon-carbon bonds, and a group which will decompose, wherein the high etch resistance structure comprises the following structure $R_1$:

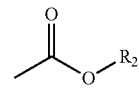

wherein $R_2$ is the group which will decompose;
   a catalyst; and
   a solvent.

8. The photoresist of claim 7, wherein the group which will decompose has a loading on the hydrocarbon backbone of between 1% and 10%.

9. The photoresist of claim 7, wherein the high etch resistance structure has the following structure:

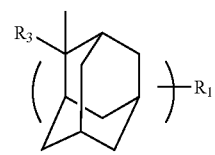

wherein R₃ is a methyl group, an ethyl group, a propyl group, an isopropyl group, a butyl group, and isobutyl group, a pentyl group, or an isopentyl group.

10. The photoresist of claim 7, wherein the high etch resistance structure has the following structure:

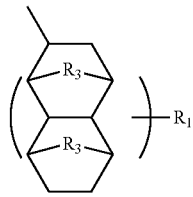

wherein R₃ is a C1 to C3 alkylene chain.

11. The photoresist of claim 7, wherein the high etch resistance structure has the following structure:

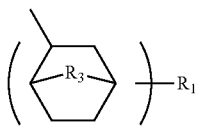

wherein R₃ is a C1 to C3 alkylene chain.

12. The photoresist of claim 7, wherein the high etch resistance structure has the following structure:

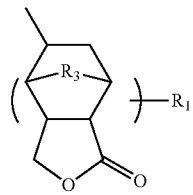

wherein R₃ is a C1 to C3 alkylene chain.

13. The photoresist of claim 7, wherein the high etch resistance structure has the following structure:

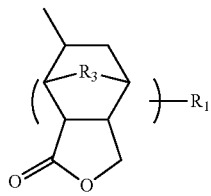

wherein R₃ is a C1 to C3 alkylene chain.

14. The photoresist of claim 7, wherein the high etch resistance structure has the following structure:

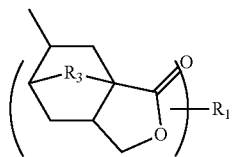

wherein R₃ is a C1 to C3 alkylene chain.

15. A method of manufacturing a semiconductor device, the method comprising:
dispensing a photoresist onto a layer to be patterned, the photoresist comprising a polymer comprising:
a hydrocarbon backbone;
a cross-linking group bonded to the hydrocarbon backbone; and
a group which will decompose bonded to the hydrocarbon backbone;
generating an acid H+ within the photoresist, wherein the acid H+ causes the group which will decompose to decompose and also causes the cross-linking group to bond with a crosslinking agent and trap a group produced by the decomposition of the group which will decompose; and
developing the photoresist after the generating the acid H+, wherein the group produced by the decomposition of the group which will decompose is present during the developing.

16. The method of claim 15, wherein the cross-linking group has a loading of between 5% and 50%, wherein the loading is based on the number of sites available on the hydrocarbon backbone.

17. The method of claim 16, the polymer further comprising a high etching resistance moiety.

18. The method of claim 17, wherein the high etching resistance moiety has a loading of between 5% and 50%.

19. The method of claim 15, wherein the cross-linking group has a loading of between 10% and 50%, wherein the loading is based on the number of sites available on the hydrocarbon backbone.

20. The method of claim 15, wherein the cross-linking group is part of a non-cleaving group with the following structure:

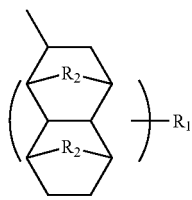

wherein R₁ is OCH₃, OC₂H₅, OC₃H₇, OC₄H₉, CH₂OCH₃, CH₂OC₂H₅, CH₂OC₃H₇, CH₂OC₄H₉, CH₂CH₂OCH₃, CH₂CH₂OC₂H₅, CH₂CH₂OC₃H₇, or CH₂CH₂OC₄H₉ and wherein R₂ is a C₁ to C₅ alkylene chain.

* * * * *